US009952267B2

United States Patent
Lee

(10) Patent No.: US 9,952,267 B2
(45) Date of Patent: Apr. 24, 2018

(54) APPARATUS AND METHOD FOR DETECTING A VARIABLE CAPACITANCE

(71) Applicant: G2TOUCH Co., LTD., Seongnam (KR)

(72) Inventor: Sung Ho Lee, Hwaseong (KR)

(73) Assignee: G2TOUCH CO., LTD., Seongnam (KR)

( * ) Notice: Subject to any disclaimer, the term of this patent is extended or adjusted under 35 U.S.C. 154(b) by 78 days.

(21) Appl. No.: 15/240,179

(22) Filed: Aug. 18, 2016

(65) Prior Publication Data

US 2016/0356832 A1    Dec. 8, 2016

Related U.S. Application Data

(62) Division of application No. 14/649,175, filed as application No. PCT/KR2013/009485 on Oct. 23, 2013, now abandoned.

(30) Foreign Application Priority Data

Dec. 6, 2012   (KR) .......................... 10-2012-0140840

(51) Int. Cl.
    *G01R 27/26*          (2006.01)
    *H03K 17/955*       (2006.01)

(52) U.S. Cl.
    CPC ......... *G01R 27/2605* (2013.01); *G01R 27/26* (2013.01); *H03K 17/955* (2013.01); *H03K 2217/960725* (2013.01)

(58) Field of Classification Search
    CPC ........................ G01R 27/2605; H03K 17/955

USPC ................................................. 324/658–690
See application file for complete search history.

(56) References Cited

U.S. PATENT DOCUMENTS

| | | | |
|---|---|---|---|
| 4,831,325 A * | 5/1989 | Watson, Jr. | ........ G01R 27/2605 324/601 |
| 4,860,232 A | 8/1989 | Lee et al. | |
| 5,194,802 A | 3/1993 | Hill et al. | |
| 7,368,920 B2 * | 5/2008 | Yakabe | ................... G01D 5/24 324/658 |
| 7,728,603 B2 | 6/2010 | Delorme et al. | |
| 2009/0224776 A1 | 9/2009 | Keith | |

(Continued)

FOREIGN PATENT DOCUMENTS

| | | |
|---|---|---|
| CN | 101796422 A | 4/2010 |
| JP | 2002-090401 A | 3/2002 |
| JP | 2005-140657 A | 6/2005 |

(Continued)

OTHER PUBLICATIONS

International Search Report received in Application No. PCT/KR2013/009485 dated Dec. 12, 2013, in 3 pages.

*Primary Examiner* — Jeff Natalini

(57) ABSTRACT

The present invention relates to a novel means and a novel method for detecting a capacitance connected to AC power, which detect a sensor capacitance on the basis of a charge sharing phenomenon occurring due to a difference between voltages applied to a sensor capacitor and an auxiliary capacitor connected to a detection system when an AC voltage applied to the detection system alternates. According to the present invention, since the sensitivity of a signal detected by a detection system is improved, a magnitude and a change amount of a sensor capacitance are stably acquired.

14 Claims, 6 Drawing Sheets

(56) References Cited

U.S. PATENT DOCUMENTS

2011/0068811 A1* 3/2011 Frojd ................ G01R 27/2605
324/681

FOREIGN PATENT DOCUMENTS

| JP | 2010-540961 A | 12/2010 |
|----|---------------|---------|
| KR | H08-304488 A | 11/1996 |
| KR | 10-2001-0039758 A | 5/2001 |
| KR | 10-2003-0077232 A | 10/2003 |
| KR | 10-0632824 B1 | 10/2006 |
| KR | 10-2011-0097851 A | 8/2011 |
| KR | 10-1190836 B1 | 10/2012 |
| KR | 10-1197460 B1 | 11/2012 |
| WO | WO 2012/121517 A2 | 9/2012 |

* cited by examiner

APPARATUS AND METHOD FOR DETECTING A VARIABLE CAPACITANCE

The present application is a divisional of U.S. application Ser. No. 14/649,175 filed on Jun. 2, 2015, which is a National Stage of International Patent Application No. PCT/KR2013/009485, filed on Oct. 23, 2013, which claims priority under 35 U.S.C. 119(a) to Korean application number 10-2012-0140840, filed on Dec. 6, 2012, in the Korean Patent Office, which are incorporated by reference in their entirety.

TECHNICAL FIELD

The present invention relates to a means and a method for detecting a capacity of a capacitor, that is, capacitance, and more particularly, to a means and a method for detecting a magnitude or a variation of capacitance by generating charging and discharging of a charge due to a change in a voltage applied to a measured capacitor when an amplitude of AC power applied to a detection system for detecting a magnitude or a variation of capacitance is changed and thus a charge is charged and discharged between the measured capacitor and an auxiliary capacitor connected to the same point as the measured capacitor and on the basis of a charge sharing phenomenon occurring between the measured capacitor and an auxiliary capacitor connected to the same point as the measured capacitor.

BACKGROUND ART

When any material having a dielectric constant is present between two electric conductors, if a voltage or a current is applied to both ends of the two electric conductors, a capacitor is formed to generate capacitance which represents charge accumulation capacity, in which a magnitude of capacitance has a correlation between a dielectric constant of a dielectric substance between the two electric conductors and an opposing area and an opposing distance between the two conductors.

As commercial capacitors manufactured by the above principle, there are various kinds such as a ceramic capacitor, an electrolytic capacitor, and a Mylar capacitor.

The capacitance of the commercial capacitor generally has a size of 1 pico Farad (1 pF), 1 nano Farad (1 nF), or 1 micro Farad (1 μF), or more and may be easily measured by a meter like a multi meter.

However, in the case in which the capacitance is equal to or less than 1 pico Farad (1 Pf), when the capacitance is measured by a simple meter like the multi meter, the capacitance may not be precisely measured due to an error in the meter and/or the capacitance which may not be measured by the meter, that is, in the case of measuring a magnitude of capacitance formed between a human hand and an elevator button, there may be a case in which the capacitance may not be measured by the meter.

In this case, the capacitance may be indirectly measured. FIG. 1 illustrates an example of a method of indirectly measuring capacitance.

Referring to FIG. 1, like the case of the capacitor formed between the human hand and the elevator button, a capacitor c1 which does not know the magnitude of capacitance and is not charged is connected to point P1 of a system for detecting capacitance and there is a need to know the magnitude of the capacitance C1 which is the capacitance of the capacitor c1 using the detection system of FIG. 1. A signal detector of FIG. 1 is a detector which detects a voltage of the point P1. When the voltage of the point P1 is detected by the signal detector of FIG. 1, it is possible to know the magnitude of the capacitance C1 which is the capacitance of the capacitor c1 by an operation.

When a capacitance C2 of a capacitor c2 charged with a voltage having an amplitude of V1 is known and the capacitor c2 is connected to the point P1 by turning on a switch SW of FIG. 1, a potential $V_p1$ at the point P1 is determined by the following <Equation 1>.

$$V_P1 = V1\frac{C2}{C2+C1} \qquad \text{<Equation 1>}$$

The capacitance C1 of the capacitor c1 which needs to be known is defined by the following <Equation 2>.

$$C1 = C2\left(\frac{V1}{V_P1} - 1\right) \qquad \text{<Equation 2>}$$

If it is assumed that in the above <Equation 1> detected by the signal detector of FIG. 1, the potential of $V_p1$ is set to be 5V, the capacitance C2 is set to be 1 pF, the V1 is set to be 10 V, it may be known from the operation of the above <Equation 2> that the magnitude of the capacitance C1 is 1 pF. Therefore, when the system for detecting capacitance is configured as illustrated in FIG. 1, it is possible to know the magnitude of capacitance without using the meter.

When the system for detecting capacitance as illustrated in the embodiment of FIG. 1 is applied to a detection system for detecting a change in distance, that is, a displacement between two objects, it is possible to detect the magnitude of capacitance and it is possible to detect the displacement using the detected capacitance.

FIG. 2 illustrates an embodiment of a sensor for detecting a displacement, in which two pistons are made of plastic or glass or face each other at a predetermined distance inside a virtual cylinder. Referring to FIG. 2, the two pistons having the same area marked by "S" face each other at a first distance "d1" inside the cylinder. When a force is applied to an upper piston to make an upper piston approach a lower piston and a distance between the upper and lower pistons is changed to "d2", "d1-d2" which is a moving distance of the upper piston may be known by using the detection system illustrated in FIG. 1.

Referring to FIG. 2, a material of which the permittivity is "∈1" is filled between the pistons of FIG. 2 and in the case in which the opposing area is "S" and the opposing distance is "d", a capacitance CVR of a capacitor c4 which is formed at both ends of the piston is defined by the following Equation 3.

$$CVR = \varepsilon1\frac{S}{d} \qquad \text{<Equation 3>}$$

If the known first distance "d1", the known opposing area "S", and the known permittivity "∈1" are substituted into the above <Equation 3>, when the first distance is "d1", "CVR1" which is the magnitude of capacitance formed between the two pistons of FIG. 2 may be known. Further, "CVR2" formed by any "d2" may be extracted based on the system for detecting capacitance of FIG. 1 and the operation of the above <Equation 1> and <Equation 2> and when the extracted "CRV2" is substituted into the above <Equation 3>, the "d2" may be known and therefore the moving distance of the upper piston of FIG. 2 may be known by the operation of "d1-d2".

FIG. 3 is a diagram illustrating an embodiment of a system for detecting capacitance in which a system for detecting capacitance illustrated in FIG. 1 is more embodied. Referring to FIG. 3, one side of a capacitor c4 generated by the configuration of FIG. 2 is connected to point P2 of FIG. 3 and the other side of the capacitor c4 is connected to a ground of the system configuring FIG. 3. c2 and c3 are a parasitic capacitor of the detection system of FIG. 3. For example, c2 may be an element formed by a layout in which the signal detector of FIG. 3 is embedded in an IC and a wiring of the point P2 reaching a switching device SW1 and the signal detector is wired with any signal line at a minute interval, intersects the signal line, or the like and the parasitic capacitor c3 may also be an element formed by modeling the parasitic capacitor formed between a gate which is an input unit of a circuit element configuring the signal detector of FIG. 3 and a system ground. The parasitic capacitor may not be limited and is variously distributed according to the configuration of the detection system.

When the switch SW1 is turned on in a state in which a switch SW2 of FIG. 3 is turned off and thus a charging voltage marked by "$V_{chg}$" is supplied to the point P2, capacitors connected to the point P2, that is, c2/c3/c4 are charged with the "$V_{chg}$" and when the capacitor c1 is in a disconnection state from the point P2 due to the turn off of the switch "SW2", the capacitor c1 is not affected by the "$V_{chg}$" (small letters c2/c3/c4 are a capacitor and capital letters C1/C2/C3/C4 are a capacitance of each capacitor). Next, when the switch "SW2" of FIG. 3 is turned on and thus the capacitor c1 charged with "V2" is connected to the point "P2", a potential "$V_p2$" which is detected by the signal detector of FIG. 3 is defined by the following <Equation 4>.

$$V_{P2} = V_{chg} + V2\frac{C1}{C1 + C2 + C3 + CVR} \qquad \text{<Equation 4>}$$

In the above <Equation 4>, the $V_p2$ is detected by the signal detector of FIG. 3 and thus an amplitude of $V_p2$ may be known and when all the amplitudes of the V2, $V_{chg}$, and C1/C2/C3 are known, the magnitude of CVR may be extracted by the operation. Further, it is possible to know a size of the distance "d2" by substituting the CVR into the above <Equation 3>. Therefore, when the first distance "d1" is known in advance, the "d1-d2" which is a displacement of the upper piston may be known.

However, the system having the modeling has several problems in detecting the CVR variation depending on the displacement of the upper piston of FIG. 2.

For example, if it is assumed that in the above <Equation 4>, C1=C2=C3=10 pF, CVR=1 pF, $V_{chg}$=1V, and V2=10V, $V_p2$=4.2258 V. When the CVR is changed by 0.1 pF from 1 pF to 0.9 pF due to the displacement of the upper piston, the $V_p2$ detected by the signal detector of FIG. 3 is 4.2362 V, and therefore when the CVR is changed by 0.1 pF, the variation of the $V_p2$ is only 4.2362−4.2258=0.0104V, that is, 10.4 mV. Although not illustrated in the signal detector of FIG. 3, an ADC which converts an analog value which is a voltage detected by the signal detector into a digital value has been used. The detected $V_p2$ approximates 4.2 V, and therefore the ADC of the signal detector for detecting the amplitude of $V_p2$ sets about 2.5V to 4.5V as a detection band. If it is assumed that a 10 bit ADC is used in a detector, the 10 bit ADC needs to detect 4.5V-3.5 V, that is, 1 V, and therefore resolution of the ADC is "1V/1024 bits" and resolution per one bit is around 1 mV. As a result, when a signal variation of a displacement sensor of FIG. 2 is 10.4 mV, only 1% of performance of the 10 bit ADC having the resolution of 1024 bits may be used.

Generally, a system having a signal to noise ratio (SNR) of 1% corresponds to a good system, but noise generally exceeds several % of a signal. Therefore, if a size of the detected signal is only around 1%, when the noise is several %, it is difficult to distinguish the signal from the noise and therefore the detected signal has reduced reliability.

As a result, when a change in magnitude of capacitance CVR detected by the system, there is a problem in that the detected signal may not be reliable.

DISCLOSURE

Technical Problem

The present invention has proposed to solve the existing problems of the system for detecting a magnitude of capacitance, and therefore an object of the present invention is to provide a detection means and a detection method for extracting a size or a variation of capacitance of a detected capacitor by applying AC power to a system power supply used in a detection system for detecting capacitance, generating charge sharing between a detected capacitor and capacitors connected to the detected capacitor due to a change in voltage applied to the detected capacitor when an amplitude of the AC power is changed, and detecting a difference in voltage on the basis of the charge sharing.

Technical Solution

According to an exemplary embodiment of the present invention, a detection means for sensing a generation of a sensor capacitance CS by an approach of objects 18 includes: a sensor 14 configured to form a sensor capacitor cs between the objects 18; an auxiliary capacitor caux configured to have one side connected to the sensor 14 and the other side connected to a system ground GND1; a switching device 10 configured to control charging the sensor capacitor cs and the auxiliary capacitor caux; and a signal detector 22 configured to detect a voltage formed in the sensor 14 in synchronization with a change in size of system power applied to a detection system 20 when the sensor capacitor cs is formed between the object 18 connected to an external ground VG and the sensor 14.

The system power may be configured of positive system power $V_{supply}$ and the system ground GND1 and the positive system power $V_{supply}$ may be a direct current (DC) voltage based on the system ground GND1.

The positive system power $V_{supply}$ and the system ground GND1 may be in-phase and a alternating AC voltage based on an earth ground.

A point of inflection at which an amplitude of the AC voltage is changed may include a DC region.

In the DC region, the sensor 14 and a capacitor connected to the sensor 14 may be charged or a result operated by the detection system 20 may be output to the outside.

When the result operated by the detection system 20 is output to the outside, the system ground GND1 and an external ground may be connected to each other.

A voltage detected by the sensor 14 on the basis of the change in amplitude of the system power applied to the detection system may have an amplitude changed on the basis of a charge sharing phenomenon of the auxiliary capacitor caux and the sensor capacitor cs.

The auxiliary capacitor caux may supply a charge required by the sensor capacitor cs and charge a charge discharged from the sensor capacitor at the time of the generation of the charge sharing phenomenon.

The auxiliary capacitor caux may be a storage capacitor cst.

The storage capacitor cst may be formed inside the detection system 20.

The auxiliary capacitor caux may be a parasitic capacitor cp.

The parasitic capacitor may be an equivalent capacitor of all the parasitic capacitors which are observed at an input terminal of the signal detector 22.

The external ground VG may not be affected by the change in size of the system power.

The external ground VG may be the earth ground.

The external ground VG may be the DC voltage.

The external ground VG may not be affected by an AC voltage applied to the system.

The voltage of the input terminal of the signal detector 22 may have a varying amplitude, while being synchronized with the change in amplitude of the system power applied to the detection system 20.

The signal detector 22 may detect the voltage from the sensor 14 on the basis of the system power applied to the detection system 20 when the sensor capacitor cs is not generated, detect the voltage from the sensor 14 when the object 18 faces the sensor 14 and is added with the sensor capacitor cs, and extract an opposing distance or an opposing area of the object 18 and the sensor 14 using a difference between the two detected voltages.

The sensor 14 may be charged with a charging voltage $V_{chg}$, the voltage detected by the signal detector 22 when the sensor capacitor cs is not generated may be determined by the following <Equation 1>, the sensor 14 may be charged with the charging voltage $V_{chg}$ when the object approaches the sensor 14 and is applied with the sensor capacitor cs, the voltage detected by the signal detector 22 may be detected by the following <Equation 2>, and the difference between the voltages may occur by a difference between the following <Equation 1> and <Equation 2>.

$$V_P = V_{supply} + V_{chg} \qquad \text{〈Equation 1〉}$$

$$V_P = (V_{supply} + V_{chg}) - V_{supply}\frac{CS}{CAUX + CS} \qquad \text{〈Equation 2〉}$$

(In the above Equations 1 and 2, $V_p$ represents the magnitude of voltage detected by the sensor 14, $V_{supply}$ represents the magnitude of alternating voltage of the system power, $V_{chg}$ represents the charging voltage based on the earth ground, CAUX represents the capacitance of the auxiliary capacitor caux, and CS represents the capacitance of the sensing capacitor cs generated between the sensor 14 and the object 18)

When the object 18 is in plural, if a plurality of sensor capacitors CSn formed between the plurality of objects and the plurality of sensors 14 are added to the input terminal of the signal detector 22, the sensor may be charged with the charging voltage $V_{chg}$ and then the voltage detected by the signal detector 22 may be determined by the following <Equation 3>.

$$V_P = (V_{supply} + V_{chg}) - V_{supply}\frac{CS1 + CS2 + \ldots + CSn}{CAUX + CS1 + CS2 + \ldots CSn} \qquad \text{〈Equation 3〉}$$

(In the above Equation 3, $V_p$ represents the magnitude of voltage detected by the sensor 14, $V_{supply}$ represents the magnitude of alternating voltage of the system power, $V_{chg}$ represents the charging voltage based on the earth ground, CAUX represents the capacitance of the auxiliary capacitor caux, CS represents the capacitance of the sensing capacitor cs generated between the sensor 14 and the object 18, and n represents the number of sensor capacitors)

The variation of capacitance occurring at each time difference of the sensing capacitance CS formed between a dynamic object and the opposing sensor 14 may be extracted on the basis of a difference occurring at each time difference of the voltage $V_p$ detected by the signal detector 22 by one or a plurality of static objects and one dynamic object 18.

The input terminal of the signal detector 22 may be in a high impedance state of 1 MΩ or more when the sensor 14 detects the voltage.

The signal detector 22 may include an ADC.

The capacitance of all the capacitors connected to the input terminal of the signal detector 22 may be positioned at a denominator of "under swing element".

Among all the capacitors connected to the input terminal of the signal detector 22 is connected to the system ground GND1, a capacitance of a fixed capacitor of which the other side is connected to the system ground GND1 may be positioned at a denominator of "under swing element".

Among all the capacitors connected to the input terminal of the signal detector 22 is connected to the system ground GND1, a capacitance of a variable capacitor of which the other side is connected to the external ground VG may be positioned at the denominator of the "under swing element".

The fixed capacitor may keep an initial charge amount even when the amplitude of the system power applied to the detection system 20 is changed.

The variable capacitor may accumulate more charges when the system power applied to the detection system 20 when the system power applied to the detection system 20 is larger than an external ground potential and discharge the accumulated charge when the system power applied to the detection system 20 is smaller than the external ground potential.

The fixed capacitor may supply the charges when the variable capacitor accumulates more charges and store the charges when the accumulated charges of the variable capacitor are discharged.

The change in amplitude of the system power applied to the detection system 20 may be made in synchronization with an up or down signal of the detection system 20.

Two surfaces configuring one sensor 14 connected to one sensor signal line 16 may be formed with the sensor capacitance CS while the sensor 14 faces different objects 18.

According to another exemplary embodiment of the present invention, a detection method for sensing a generation of a sensor capacitance CS by an approach of an object 18 includes: (a) adding a sensor capacitor cs formed between the object 18 connected to an external ground VG and the sensor 14 while the object 18 faces the sensor 14; (b) applying a charging voltage $V_{chg}$ to an auxiliary capacitor caux which has one side commonly connected to the sensor 14 and the other connected to a system ground VG; (c) applying alternating system power to the detection system 20 to which the sensor 14 is connected and detected, by the signal detector 22, a voltage from the sensor to detect a size or a variation of the sensor capacitor.

The system power may be configured of positive system power $V_{supply}$ and the system ground GND1 and the positive system power $V_{supply}$ may be a DC voltage based on the system ground GND1.

The positive system power $V_{supply}$ and the system ground GND1 may be in-phase and a alternating AC voltage based on an earth ground.

A point of inflection at which an amplitude of the AC voltage is changed may include a DC region.

In the DC region, the sensor 14 and a capacitor connected to the sensor 14 may be charged or a result operated by the detection system 20 may be output to the outside.

When the result operated by the detection system 20 is output to the outside, the system ground GND1 and an external ground may be connected to each other.

A voltage detected by the sensor 14 on the basis of the change in amplitude of the system power applied to the detection system may have a varying magnitude on the basis of a charge sharing phenomenon of the auxiliary capacitor caux and the sensor capacitor cs.

The auxiliary capacitor caux may supply a charge required by the sensor capacitor cs and charge a charge discharged from the sensor capacitor at the time of the generation of the charge sharing phenomenon.

The auxiliary capacitor caux may be a storage capacitor cst.

The storage capacitor cst may be formed inside the detection system 20.

The auxiliary capacitor caux may be a parasitic capacitor cp.

The parasitic capacitor may be an equivalent capacitor of all the parasitic capacitors which are observed at an input terminal of the signal detector 22.

The external ground VG may not be affected by the change in size of the system power.

The external ground VG may be the earth ground.

The external ground VG may be the DC voltage.

The external ground VG may be an AC voltage which is not be affected by an AC voltage applied to the system.

The voltage of the input terminal of the signal detector 22 may have a varying magnitude, while being synchronized with the change in amplitude of the system power applied to the detection system 20.

The signal detector 22 may detect the voltage from the sensor 14 on the basis of the system power applied to the detection system 20 when the sensor capacitor cs is not generated, detect the voltage from the sensor 14 when the object 18 is added to the sensor capacitor cs while facing the sensor 14, and extract an opposing distance or an opposing area of the object 18 and the sensor 14 using a difference between the two detected voltages.

The sensor 14 may be charged with a charging voltage $V_{chg}$, the voltage detected by the signal detector 22 when the sensor capacitor cs is not generated may be determined by the following <Equation 4>, the sensor 14 may be charged with the charging voltage $V_{chg}$ when the object approaches the sensor 14 and is applied with the sensor capacitor cs, the voltage detected by the signal detector 22 may be detected by the following <Equation 5>, and the difference between the voltages may occur by a difference between the following <Equation 4> and <Equation 5>.

$$V_P = V_{supply} + V_{chg} \qquad \text{(Equation 2)}$$

$$V_P = (V_{supply} + V_{chg}) - V_{supply} \frac{CS}{CAUX + CS} \qquad \text{(Equation 5)}$$

(In the above Equations 4 and 5, $V_p$ represents the amplitude of voltage detected by the sensor 14, $V_{supply}$ represents the amplitude of alternating voltage of the system power, $V_{chg}$ represents the charging voltage based on the earth ground, CAUX represents the capacitance of the auxiliary capacitor caux, and CS represents the capacitance of the sensing capacitor cs generated between the sensor 14 and the object 18)

When the object 18 is in plural, if a plurality of sensor capacitors CSn formed between the plurality of objects and the plurality of sensors 14 are added to the input terminal of the signal detector 22, the sensor may be charged with the charging voltage $V_{chg}$ and then the voltage detected by the signal detector 22 may be determined by the following <Equation 6>.

$$V_P = (V_{supply} + V_{chg}) - V_{supply} \frac{CS1 + CS2 + \ldots + CSn}{CAUX + CS1 + CS2 + \ldots CSn} \qquad \text{(Equation 6)}$$

(In the above Equation 6, $V_p$ represents the amplitude of voltage detected by the sensor 14, $V_{supply}$ represents the amplitude of alternating voltage of the system power, $V_{chg}$ represents the charging voltage based on the ground, CAUX represents the capacitance of the auxiliary capacitor caux, CS represents the capacitance of the sensing capacitor cs generated between the sensor 14 and the object 18, and n represents the number of sensor capacitors)

The variation occurring at each time difference of the sensing capacitance CS formed between a dynamic object and the opposing sensor 14 may be extracted on the basis of a difference occurring at each time difference of the voltage $V_p$ detected by the signal detector 22 by one or a plurality of static objects and one dynamic object 18.

The input terminal of the signal detector 22 may be in a high impedance state of 1 MΩ or more when the sensor 14 detects the voltage.

The signal detector 22 may include an ADC.

The capacitance of all the capacitors connected to the input terminal of the signal detector 22 may be positioned at a denominator of "under swing element".

Among all the capacitors connected to the input terminal of the signal detector 22 is connected to the system ground GND1, a capacitance of a fixed capacitor of which the other side is connected to the system ground GND1 may be positioned at a denominator of "under swing element".

Among all the capacitors connected to the input terminal of the signal detector 22 is connected to the system ground GND1, a capacitance of a variable capacitor of which the other side is connected to the external ground VG may be positioned at the denominator of the "under swing element".

The fixed capacitor may keep an initial charge amount even when the amplitude of the system power applied to the detection system 20 is changed.

The variable capacitor may accumulate more charges when the system power applied to the detection system 20 when the system power applied to the detection system 20 is increased based on an external ground potential and discharges the accumulated charges when the system power applied to the detection system 20 is reduced based on the external ground potential.

The fixed capacitor may supply the charges when the variable capacitor accumulates more charges and store the charge when the accumulated charge of the variable capacitor is discharged.

The change in amplitude of the system power applied to the detection system 20 may be made in synchronization with an up or down signal of the detection system 20.

Two surfaces configuring one sensor 14 connected to one sensor signal line 16 may be formed with the sensor capacitance CS while the sensor 14 faces different objects 18.

According to still another exemplary embodiment of the present invention, a means for detecting capacitance connected to AC power includes:

a fixed capacitor configured to have fixed capacitance;

a variable capacitor configured to generate variable capacitance varying in response to an opposing distance or an opposing area from an external object; and a signal detector configured to detect a change in voltage due to a charge flowing between the fixed capacitor and the variable capacitor in synchronization with an alternating current voltage applied to the fixed capacitor.

Preferably, the means may further include: a switching device configured to charge the fixed capacitor with a DC voltage or keep a floating state to conserve a charged charge after the charging, wherein the signal detector may acquire the variable capacitance of the variable capacitor on the basis of the detected change in voltage.

Preferably, the means may further include: a sensor configured to sense the change in voltage, wherein the variable capacitor may be formed between an electric conductor contacting the object and the sensor.

Preferably, an interval between the object and the electric conductor or a contact area between the electric wire and the object may be acquired on the basis of the variable capacitance of the variable capacitor acquired by the signal detector.

Preferably, the fixed capacitor may have equivalent capacitance to a capacitance of a parasitic capacitor generated by a connection to the signal detector and a capacitance of a storage capacitor in which the charge is stored.

Preferably, the means may further include: a first ground; and a second ground, wherein the fixed capacitor may be grounded to the first ground and the variable capacitor may be grounded to the second ground.

Preferably, the first ground may be the same frequency as the alternating current voltage and in-phase with the alternating current voltage and may keep an amplitude difference at a constant size to apply a DC voltage based on the first ground to the fixed capacitor.

Preferably, the second ground may be an earth ground in which the DC voltage is zero or a DC voltage having a constant amplitude.

Preferably, the first ground and the second ground may be connected to each other at the time of outputting a result of the signal detector and the AC voltage may keep the DC voltage having a constant amplitude.

Preferably, the first ground and the AC voltage may have a first frequency during a first duration, have a second frequency different from the first frequency during a second duration different from the first duration, and the first frequency and the second frequency may be alternated.

Preferably, the means may further include a sensor configured to include two opposing sensing surfaces and be connected to one sensor signal line to sense the change in voltage, wherein two variable capacitors may be generated by different objects contacting each sensing surface.

Preferably, the means may further include: a plurality of sensors configured to sense the change in voltage, wherein a plurality of variable capacitors may be generated by the plurality of objects applied to the plurality of sensors.

Preferably, the signal detector may sense a first voltage of the sensor or each sensor among the plurality of sensors when the variable capacitance is not generated and a second voltage of the sensor or each sensor among the plurality of sensors when the variable capacitance generated by the object is generated and acquire the variable capacitance or the plurality of variable capacitances on the basis of a difference between the first voltage and the second voltage.

Preferably, the first voltage may be a sum of a first charging voltage (first $V_{chg}$) which is the DC voltage having a constant amplitude and the AC voltage and the second voltage is a difference between the first voltage and a voltage sensed by the sensor after a flow of the charge between the fixed capacitor and the variable capacitor is completed.

Preferably, the means may further include an earth ground which is the DC voltage having a constant amplitude, wherein the variable capacitor may accumulate the charge supplied from the fixed capacitor when the AC voltage is increased based on the earth ground and the fixed capacitor may accumulate the charge supplied from the variable capacitor when the AC voltage is reduced based on the earth ground.

Preferably, an input terminal of the signal detector may have a high impedance of at least 1 MΩ or more.

The present invention provides a method for detecting capacitance connected to AC power.

According to still yet another exemplary embodiment of the present invention, a method for acquiring variable capacitance by a system including a sensor sensing a change in voltage, a fixed capacitor having and fixed capacitance, and a variable capacitor generating variable capacitance varying in response to an opposing distance or an opposing area from an external object includes:

charging the sensor and the fixed capacitor with a charging voltage which is a DC voltage;

applying an AC voltage to the fixed capacitor;

detecting, by a signal detector, a change in voltage due to a charge flowing between the fixed capacitor and the variable capacitor in synchronization with the AC voltage;

acquiring the variable capacitance on the basis of the change in voltage.

Preferably, the variable capacitance may be formed between an electric conductor contacting the object and the sensor.

Preferably, the method may further include: turning off a switching device to keep a floating state so as to conserve the charge charged in the sensor and the fixed capacitor between the charging of the DC voltage and the applying of the AC voltage; and acquiring an interval between the object and the electric wire or a contact area between the electric wire and the object on the basis of the variable capacitance.

Preferably, the fixed capacitor may have equivalent capacitance to a capacitance of a parasitic capacitor generated by a connection to the signal detector and a capacitance of a storage capacitor in which the charge is stored.

Preferably, the method may further include: grounding a first ground to the fixed capacitor; and grounding a second ground to the variable capacitor.

Preferably, the first ground may be the same frequency as the alternating current voltage and in-phase with the alternating current voltage and may keep an amplitude difference of a constant size to apply a DC voltage based on the first ground to the fixed capacitor.

Preferably, the second ground may be an earth ground in which the DC voltage is zero or a DC voltage having a constant amplitude.

Preferably, the first ground and the second ground may be connected to each other at the time of outputting a result of the signal detector and the AC voltage may keep the DC voltage having a constant amplitude.

Preferably, the first ground and the AC voltage may have a first frequency during a first duration, have a second frequency different from the first frequency during a second duration different from the first duration, and the first frequency and the second frequency may be alternated.

Preferably, the method may further include: generating two variable capacitors on each of the two opposing sensing surfaces of the sensor by contacting between two different objects.

Preferably, the method may further include: generating a plurality of variable capacitors by the plurality of objects contacting the sensors which are formed in plural.

Preferably, the signal detector may sense a first voltage of the sensor or each sensor among the plurality of sensors when the variable capacitance is not generated and a second voltage of the sensor or each sensor among the plurality of sensors when the variable capacitance generated by the object is generated and acquire the variable capacitance or the plurality of variable capacitances on the basis of a difference between the first voltage and the second voltage.

Preferably, the first voltage may be a sum of the charging voltage and the AC voltage and the second voltage is a difference between the first voltage and a voltage sensed by the sensor after a flow of the charge between the fixed capacitor and the variable capacitor is completed.

Preferably, the method may further include: an earth ground which is the DC voltage having a constant amplitude, wherein the variable capacitor may accumulate the charge supplied from the fixed capacitor when the AC voltage is increased based on the earth ground and the fixed capacitor may accumulate the charge supplied from the variable capacitor when the AC voltage is reduced based on the earth ground.

Preferably, an input terminal of the signal detector may have a high impedance of at least 1 MΩ or more.

Advantageous Effects

According to the method and method for detecting capacitance connected to AC power in accordance with the present invention, it is possible to detect the size or the variation of capacitance on the basis of the phenomenon that the accumulated charge amount is changed in response to the change in size of the voltage applied to the detected capacitor for detecting the size or the variation of capacitance when the amplitude of the system power applied to the system for detecting capacitance is changed and the difference in voltage detected by the detector in response to the change in charge amount occurs.

BEST MODE

Figure 1:
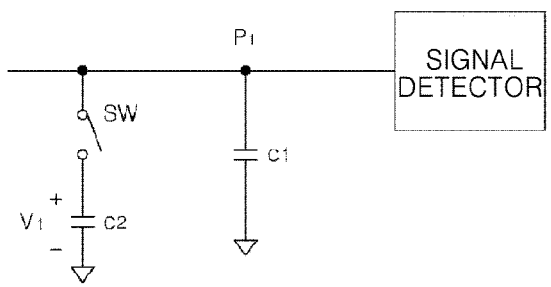
FIG. 1 is a diagram illustrating the existing embodiment of indirectly measuring capacitance.
Figure 2:
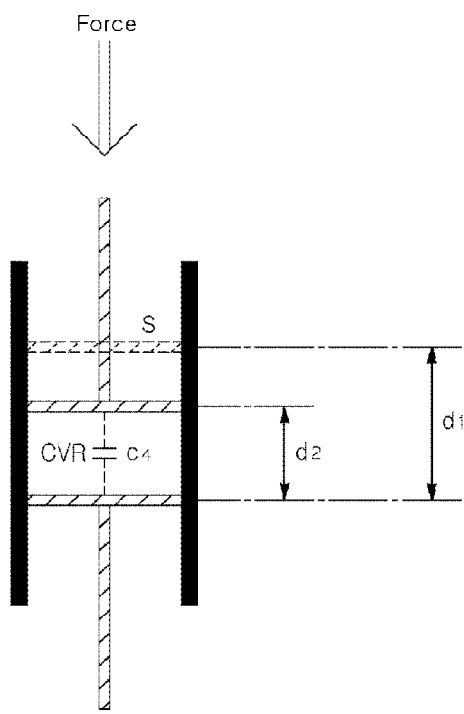
FIG. 2 is a diagram illustrating an embodiment of a sensor for detecting a displacement.
Figure 3:
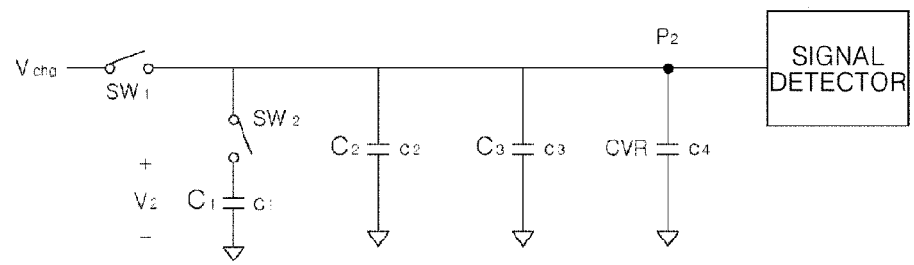
FIG. 3 is a diagram illustrating an embodiment in which a system for detecting capacitance illustrated in FIG. 1 is more embodied.

Hereinafter, exemplary embodiments of the present invention will be described in detail with reference to the accompanying drawings.

First, the present invention relates to a means and a method for detecting capacitance connected to AC power, and more particularly, to a means and a method for easily detecting a change in capacitance of a capacitor in response to a change in distance between two electric conductors configuring the capacitor or a change in an opposing area between the two electric conductors.

The present invention relates to a detection of capacitance which is formed between a finger or an electric conductor (hereinafter, referred to as an object) having electrical characteristics similar thereto and a sensor. Herein, the term "non-contact input" means that the capacitance is formed in a state in which the object and the sensor are spaced apart from each other at a predetermined distance. The object may contact an outer surface of a substrate which covers the sensor. However, even in this case, the object and the sensor keep the non-contact state. Therefore, the contact of the object to the sensor may be expressed by a term called "approach" Meanwhile, the object may keep a contact state to the outer surface of the substrate covering the sensor, and therefore the "approach" and the "contact" are in common use herein.

Further, components like "~unit" to be described below are components playing any roles and means components playing a unit role like a signal input unit configured of a buffer or software or hardware components like a field-programmable gate array (FPGA) or an application specific integrated circuit (ASIC). Further, the "~unit" may be included in an upper-level component or another "~unit" or may include lower-level components and other "~units". Further, the "~unit" itself may also have an independent CPU.

In the drawings, to clearly represent layers and regions, a thickness or a region are exaggerated in the drawings for clarity. Like reference numerals designate like elements throughout the specification. It will be understood that when an element such as a layer, a region, etc., is referred to as being "on" another element, it can be directly on the other element or intervening elements may also be present. In contrast, when an element is referred to as being "directly on" another element, there are no intervening elements present.

Further, a "signal" described herein is collectively referred to as a voltage or a current unless specially indicated.

Further, in the present specification, "capacitance" represents capacity which may accumulate a charge may be accumulated and a "capacitor" represents an element having capacitance. In the present specification, the capacitor is represented by a small letter in the English alphabet and the capacitance is represented by a capital letter in the English alphabet. For example, c1/C1 means that a capacitance of a capacitor marked by c1 is C1.

According to an embodiment of the present invention, a switching device may be a relay, a metal oxide semiconductor (MOS) switch, a bipolar junction transistor (BJT), a field effect transistor (FET), a metal oxide semiconductor field effect transistor (MOSFET), an insulated gate bipolar transistor (IGBT), a thin film transistor (TFT), and an OPAMP and may be formed by homo-coupling or hetero-coupling therebetween. As the switching device, all the devices which may turn on/off input and output independent of the number of input and output terminals may be used.

Meanwhile, as an example of the switching device, the CMOS switch is configured of a combination of PMOS and NMOS and has input and output terminals which are connected to each other but on/off control terminals which are individually present to connect to the same control signal together or separately connect to an individual control signal, thereby determining an on/off state. The relay is an element which outputs a voltage or a current applied to an input terminal when a current is applied to a control terminal and the BJT is an element which makes a current amplified by a predetermined amount flow from a collector to an emitter when a current flows in a base terminal in a state in which a voltage higher than a threshold voltage of a base is applied to a base. Further, a TFT is a switching device which is used in a pixel unit configuring a display device such as an LCD and an AMOLED and is configured to include a gate terminal which is a control terminal, a source terminal which is an input terminal, and a drain terminal which is an output terminal, in which when a voltage which is larger by a threshold voltage than a voltage applied to a drain terminal is applied to the gate terminal, the TFT is a device which is conducted and thus makes a current depending on an amplitude of voltage applied to the gate terminal flow from the input terminal to the output terminal.

Further, in the present specification, "forcing a signal" means that a level of a signal which already keeps any state is changed or a connection to any signal in a current floating state. For example, forcing the signal to an on/off control terminal of the switching device may mean that the existing low level voltage is changed to a high level and any voltage is applied to the on/off control terminal of the switching device in the floating state to turn on/off the switching device without any signal.

Further, the present invention detects a magnitude or a variation of capacitance formed between a sensor and an electric conductor and the magnitude of capacitance or capacitance may be used with the same meaning. Further, a capacitor to detect the magnitude or the variation of capacitance is collectively referred to as a "detected capacitor".

A detection system used in the present specification may be a "circuit object" in which ICs which are an integrated circuit or various circuit components are connected to each other on a PCB, a portion of the IC, or a portion of the "circuit object". For example, applying the AC power to the detection system means that the AC power is applied to all the ICs or all the circuit objects or the AC power is applied to only a portion of the ICs or a portion of the circuit objects.

Further, in the present specification, an earth ground or an absolute ground has 0 (zero) V which is a ground potential and the ground, the absolute ground, and the ground potential are used with the same meaning.

The detection system is supplied with power based on a ground potential of the detection system itself and power of the detection system and the ground is collectively referred to as system power. Further, the system power is used while being divided into positive system power and a system ground, in which the positive system power is a voltage supplied to the detection system based on the system ground.

Further, all the voltages or potentials have an amplitude determined based on the ground potential, unless specially indicated. For example, when the positive system power is 20 V, the amplitude of the positive system power means 20V based on the ground potential and when the positive system power is 5V based on the system ground, a potential difference between the positive system power and the system ground means 5 V.

Further, in the present specification, a voltage and a potential is used as an equivalent meaning and a voltage having a specific amplitude is represented by a potential.

Further, the system power supplied to the detection system is internal power. Therefore, all the power other than the internal power is called external power or an external potential. The earth ground is also the external potential.

The AC voltage applied to the detection system of the present invention may be generated by a battery. A ground of the battery is a floating ground, and therefore when the ground of the battery and the earth ground are not connected to each other, the AC voltage of the present invention generated by the battery may not define an absolute amplitude based on the ground potential. Therefore, by using the ground potential as a reference to describe an absolute amplitude of the AC voltage generated by the floating ground like the battery, it is assumed that the ground potential and the floating ground like the ground of the battery are grounded.

Further, in the present specification, all a potential of point P, a potential detected by the sensor 14, a potential detected by the signal detector 22, or a potential detected at an input terminal of the buffer 15 have the same meaning.

Further, $V_{supply}$ or VG which is a symbol representing the amplitude of voltage may be used as a symbol representing the amplitude of voltage or a specific voltage. For example, the $V_{supply}$ is a symbol representing the positive system power and is used at an amplitude of voltage representing a alternating voltage of 20 V.

Figure 4:
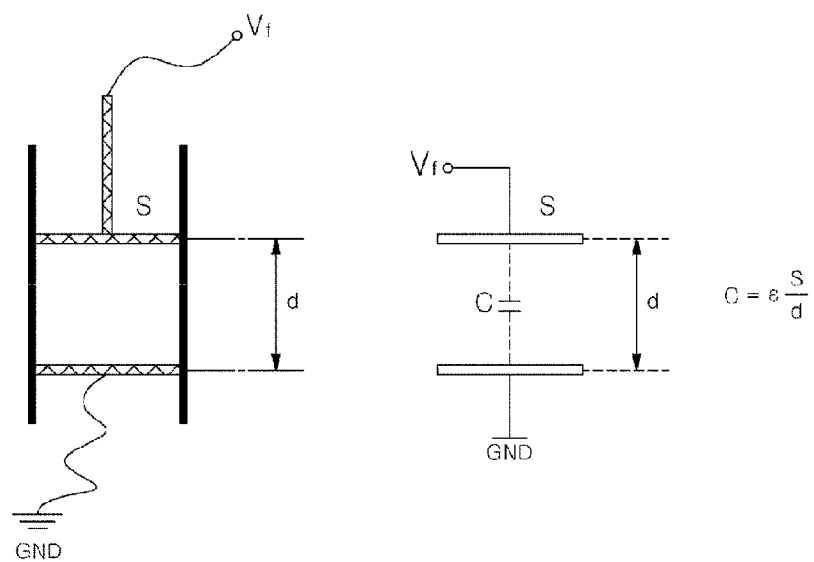
FIG. 4 is a diagram illustrating an embodiment of a displacement sensor which is configured of two pistons.

Prior to describing in detail embodiments of the present invention, a principle of detecting capacitance according to the present invention will be briefly described with reference to FIG. 4 which illustrates an embodiment of a displacement sensor configured of two pistons. FIG. 4 illustrates a cylinder which is made of glass or plastic or is configured of two pistons facing each other inside a virtual body. In a real use example, a shape of the piston is not limited and has various geometrical shapes. For example, a piston is formed in a circle, a quadrangle, or various polygons. The pistons facing each other may have the same geometrical shape but may have different geometrical shapes. In this aspect, the body supporting the two pistons is a virtual body and a piston over the cylinder or a piston under the cylinder may have a position or an opposing area which may be changed by a force applied from the outside or independent energy.

A material having predetermined permittivity is filled between the two pistons. For example, permittivity of air is 1 and permittivity of glass is about 5 or 6. Further, the two pistons may be each applied with a predetermined voltage. In the embodiment illustrated in FIG. 4, the upper piston is applied with a voltage marked by Vf and the lower piston is applied with 0 (zero) V.

According to the embodiment illustrated in FIG. 4, an attempt to detect the displacement of the two pistons using a change in capacitance formed between the two pistons is a good embodiment of the present invention. Alternatively, an elevator system for making a human finger approach a button of an electronic elevator and detecting a capacitance of a capacitor formed between the button and the human finger to measure a distance between the human finger and the button and drive an elevator based on the measured distance is another embodiment of the present invention.

Referring to FIG. 4 which illustrates the embodiment of the present invention, two electric conductors face each other at an opposing area "S" and an opposing distance "d" and a dielectric substance of which the permittivity is "∈" is charged between the two electric conductors. As can be appreciated from an equivalent circuit and Equation at the right of FIG. 4, the capacitor is formed between the two electric conductors and the formed capacitor has capacitance C defined by Equation at the right of FIG. 4.

When a voltage or a current is supplied to the two electric conductors having the capacitance "C", the capacitor is accumulated with a charge depending on a relational expression of V=Q/C. Here, V represents an amplitude of voltage applied to the capacitor, C represents the generated capacitance, and Q is a charge quantity accumulated in the capacitor.

Referring to Equation of "V=Q/C", the charge quantity accumulated in the capacitor having the same capacitance is changed in response to the change in voltage applied to the capacitor or even though the voltage applied to the capacitor is the same, when the magnitude of capacitance is changed, a difference in charge quantity stored in the capacitor occurs.

The principle is applied to FIG. 4 as follows. When a distance between the pistons facing each other of FIG. 4 is constantly maintained, if an amplitude of voltage Vf applied to one side of the piston is increased, the charge quantity accumulated in the capacitor formed between the pistons facing each other is increased and when the distance between the two pistons is narrow by the movement of the upper piston, in FIG. 4, the detected capacitance is increased and therefore the charge quantity accumulated between the pistons by the same applied voltage Vf will be increased.

In this case, the piston facing the piston to which the voltage called the Vf is applied is connected to the ground for the movement of a current. The ground is a 0 (zero) V potential, a DC voltage like 1V or 100 V, or an AC voltage of which the amplitude and phase are changed.

Figure 5:
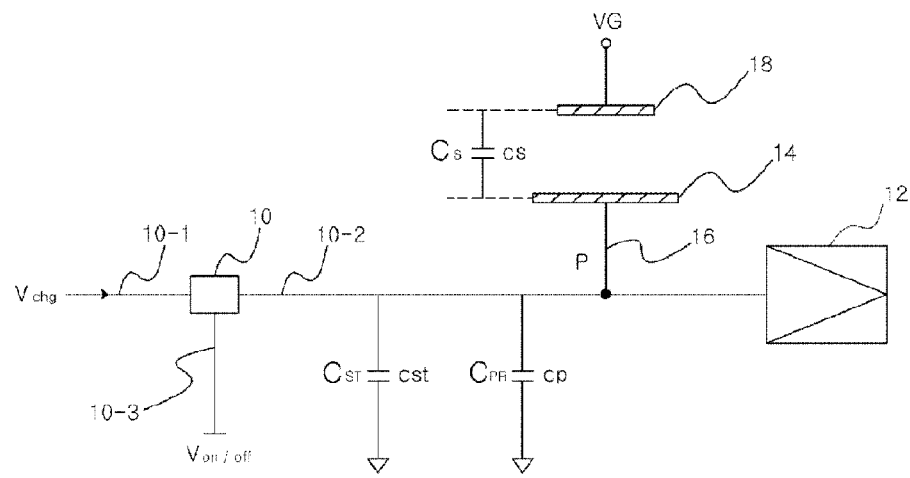
FIG. 5 is a circuit diagram illustrating a basic structure of a system for detecting capacitance according to an embodiment of the present invention.

FIG. 5 is a circuit diagram illustrating a basic structure of a system for detecting capacitance according to an embodiment of the present invention. Referring to FIG. 5, the system for detecting capacitance has a basic structure configured of a switching device 10, a sensor 14, a sensor signal line 16, a storage capacitor cst, a parasitic capacitor cp, and a high impedance input device 12.

When Von which is a high voltage is applied to a switch on/off control terminal 10-3, the switching device 10 is turned on and outputs a charging voltage $V_{chg}$ input to a switch input terminal 10-1 to a switch output terminal 10-2 and applies the charging voltage to the sensor 14 and all the capacitors connected to the sensor 14 for a predetermined time to charge the sensor 14 and all the capacitors with an amplitude of "$V_{chg}$". When the charging is completed, a low Voff voltage is applied to the switch on/off control terminal 10-3 to turn off the switching device 10, and as a result, the charging voltage $V_{chg}$ charged in the capacitor connected to the point P is removed and the point P keeps the charging voltage. A resistance component of a predetermined size is present in a path from the switching device 10 to the capacitor connected to the point P and a path up to the high impedance input device 12, and as a result, the delay of the charging time occurs, but in the present specification, it is assumed that there is no resistance component.

According to the embodiment of the present invention, to detect a potential of the point P, there is a need to use the high impedance input device 12. As the high impedance (hereinafter, Hi-z) input device 12, a gate terminal such as a buffer, an OPAMP, and a MOS/FET is used. In the following specification, as the Hi-z input device 12, the buffer 15 is used. The buffer 15 or the Hi-z input device 12 is a component configuring the signal detector 22 and is included in the signal detector 22 of FIG. 6, but FIG. 6 separately illustrates the signal detector 22 and the buffer 15 to emphasize the Hi-z input.

When the point P is charged with the charging voltage $V_{chg}$ and then the switching device 10 is turned off, the capacitors connected to the point P of FIG. 5 start discharging and to minimize the discharging, the switching device 10 and the buffer 15 connected to the point P may be preferably in a Hi-z state. The impedance of the input device in the Hi-z state is equal to or more than at least 1 MΩ. Further, the impedance in an off state of the switching device 10 which is detected at the point P is equal to or more than at least 1 MΩ.

The signal detector 22 repeats a process of detecting the voltage of the point P by a charge sharing phenomenon to be described below to operate the capacitance formed between the sensor 14 and the object 18, again charging the point P with the $V_{chg}$ during the operation or after the operation is completed, and detecting the voltage of the point P on the basis of the charge sharing phenomenon.

cst is a storage capacitor and serves to supply a charge to a sensor capacitor cs of FIG. 5 or charge a charge discharged from the sensor capacitor cs. The storage capacitor cst may be formed in the detection system 20 to be described below or may be attached to the outside of the detection system.

cp is a parasitic capacitor and is to total sum of all the parasitic capacitors observed at the point P of FIG. 5, that is, an equivalent capacitor. For example, although not illustrated, the parasitic capacitor is also present between the output terminal 10-2 of the switching device 10 and the switch on/off control terminal 10-3 and is also present at the input terminal of the Hi-z input device 12. Further, when the plurality of sensors 14 are used, if the plurality of sensor signal lines 15 are wired to be adjacent to each other, the parasitic capacitor is also present therebetween.

The detection system 20 necessarily includes the cst and therefore the cst may be formed inside the detection system 20. Alternatively, the detection system 20 may use the naturally formed cp to serve as the storage capacitor. Referring to the cst or the cp of FIG. 5, the cst or the CP is connected to the same P point and is connected to the same ground. Therefore, the cst and the cp may be configured of one equivalent circuit by a simple circuit knowledge, which is then marked by an auxiliary capacitor caux and auxiliary capacitance CAUX. The auxiliary capacitor caux serves to supply a charge to a variable capacitor to be described below or accumulate a charge emitted from the variable capacitor by the charge sharing phenomenon to be described below.

cs is a sensor capacitor formed via the sensor 14 and the object 18 and a dielectric substrate therebetween and has capacitance of a magnitude called "CS". An example of the object 18 may include a finger touching a key of an elevator and since a size of finger differs from individual to individual and the opposing area and the opposing distance are changed over time, the magnitude of the sensor capacitance is changed frequently.

According to the embodiment of the present invention, an external power supply, not a system power supply, as a ground is used in the object 18, in which the external power supply may be directly connected to the object 18 like the ground connected to the lower cylinder of FIG. 4 and may be virtually connected to the object 18 like a person standing on an earth virtually connecting to an ground potential. In the present specification, the external power supply connected to the object 18 as the ground is called an external ground and is marked by a virtual ground VG.

The virtual ground VG is an earth ground or is a DC voltage or an AC voltage based on the earth ground. For example, when a person holds a three wavelength fluorescent light in one hand and presses the key of the elevator in another hand, the VG will be an alternating current voltage output from the three wavelength fluorescent light. As the virtual ground VG, the floating ground like the ground of the battery may also be used. When the floating ground is used, all the voltage of the detection system has an amplitude defined based on the floating ground. In the present specification, the earth ground includes a floating ground and may be used as the same meaning.

Figure 6:
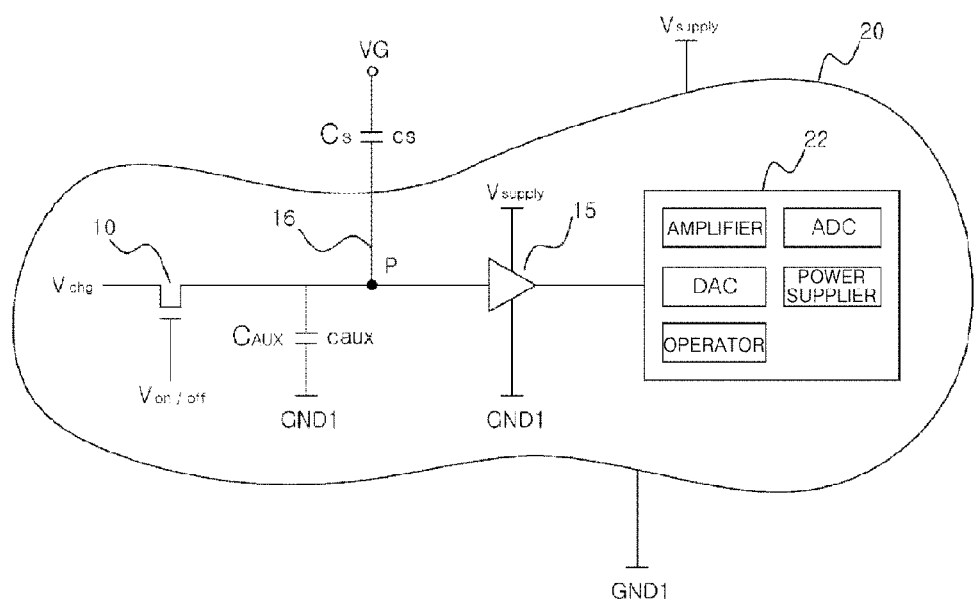
FIG. 6 is an embodiment of a circuit for detecting a sensor capacitance according to an embodiment of the present invention.

FIG. 6 illustrates a circuit detecting the sensor capacitance according to an embodiment of the present invention. A method for detecting a capacitance CS of a sensor capacitor cs will be described below with reference to FIG. 6. A portion enclosed by an oval line in FIG. 6 is the detection system 20. The detection system 20 includes the signal detector 22 and may generate the AC voltage which is the system power or include a CPU. The system power may be generated from the detection system 20 and may also be supplied from the outside.

The AC power used for the detection system 20 to detect the sensor capacitance CS of the sensor capacitor cs is called the system power or a system voltage, in which the system power is configured of the $V_{supply}$ which is a positive system power and a system ground GND1.

The $V_{supply}$ which is the positive system power is a DC voltage based on the GND1 which is the system ground. For example, the $V_{supply}$ is a 3.3V DC voltage based on the GND1.

The $V_{supply}$ is the DC voltage based on the GND1 but the $V_{supply}$ is the AC voltage of which the amplitude and phase are changed based on the earth ground. For example, the $V_{supply}$ may rise or fall by 10V based on the earth ground. Alternatively, the $V_{supply}$ may rise or fall by 15V at any timing or rise or fall by 20V at any timing. In the present specification, rising or falling of the system power by a predetermined voltage is called a swing.

Further, as one example, the AC voltage used as a system voltage may have a varying phase like rising or falling by 10V for 10 μS and rising or falling by 10V for 20 μS.

Since the $V_{supply}$ and the GND1 are the DC voltage keeping a difference in voltage having a constant amplitude therebetween and the $V_{supply}$ is the AC voltage of which the amplitude and phase are changed based on the earth ground, the GND1 is also the AC voltage of which the amplitude and phase are changed based on the earth ground like the $V_{supply}$.

Since the system power used in the detection system 20 is the AC power based on the earth ground or is the DC voltage based on the GND1, it is possible to use the system power as the voltage for the operation of the signal detector 22 of the detection system 20.

To output any value operated by the signal detector 22 to the outside, the system ground GND1 and a ground of an external structure receiving a signal may be preferably connected to each other. In this case, the AC voltage applied to the signal detector 22 may preferably keep a waveform of the non-alternating DC voltage. This is timing t1 or timing t2 of FIG. 8 and the AC voltage includes the DC region keeping a constant amplitude for a predetermined time at a point of inflection of the alternating. The DC region included in the AC voltage is a region required to secure the charging time to be described below or transmit the signal of the signal detector to the outside. For example, any operation is completed in the signal detector 22 at the timing t2 of region 1 of FIG. 8 and thus to output any operated value to the outside which is not illustrated, the GND1 which is 25V may be connected to the earth ground or the ground of the upper system in which the detection system 20 is included and the upper system may also have a floating ground in which a DC battery is used.

The outside based on the signal detector 22 may be an outside of an IC in which the signal detector 22 is included or an outside of a PCB in which the signal detector 22 is included. On the other hand, the outside may be another region in which the signal detector 22 is excluded from an inside of the IC or an inside of the PCB. For example, when the signal detector 22 inside the IC and a driver driving the piston of FIG. 4 are present in different regions and the ground of the driver and the system ground GND1 used in the signal detector 22 are different, the driver present in the same IC may be represented by the outside.

The auxiliary capacitor caux of FIG. 6 is an equivalent capacitor of the storage capacitor cst and the parasitic capacitor cp. Further, the sensor capacitor cs is a capacitor formed between the sensor 14 and the object 18 of FIG. 5 and a magnitude of capacitance is CS.

The sensor 14 is connected to the sensor signal line 16 and may be positioned to be far away from the detection system 20. Further, when the plurality of detection systems 20 are used, the plurality of sensors 14 may be disposed to be spaced apart from each other at a predetermined distance. In this case, when the sensor signal lines 16 connected to the sensor 14 are adjacent to each other, the parasitic capacitor cp is generated between the sensor signal lines 16 and the parasitic capacitance is included in the auxiliary capacitance CAUX of FIG. 6.

According to the embodiment of the present invention, the detection system 20 including the switching device 10, the buffer 15, the signal detector 22, or the like other than the object 18 is applied with the system power. The system power is configured of the "$V_{supply}$" which is the positive system voltage and the "GND1" which is the system ground, in which the $V_{supply}$ is DC with respect to the GND1 or an alternating current with respect to the ground. For example, the $V_{supply}$ and the GND1 are the DC voltage keeping a potential difference of 5V therebetween. However, the system voltage is AC with respect to the earth ground like the embodiment of FIG. 7 or 8.

The detection system 20 may be implemented as an integrated circuit (hereinafter, IC) or a circuit which is mounted in the PCB and a method for implementing the detection system 20 is configured by a combination of various parts which are not limited. When the detection system 20 uses only some region of the IC or the PCB, the alternating current voltage may be supplied only to the detection system 20 which is some region of the IC or the PCB. Alternatively, the alternating current voltage may also be supplied to the whole region of the IC or the circuit of the whole PCB depending on the circuit configuration.

The AC voltage which is the system power is a voltage of which the amplitude and phase are regularly alternated or a voltage of which the amplitude and phase are non-regularly changed. The alternating current voltage will be described below with reference to FIGS. 7 and 8.

Figure 7:
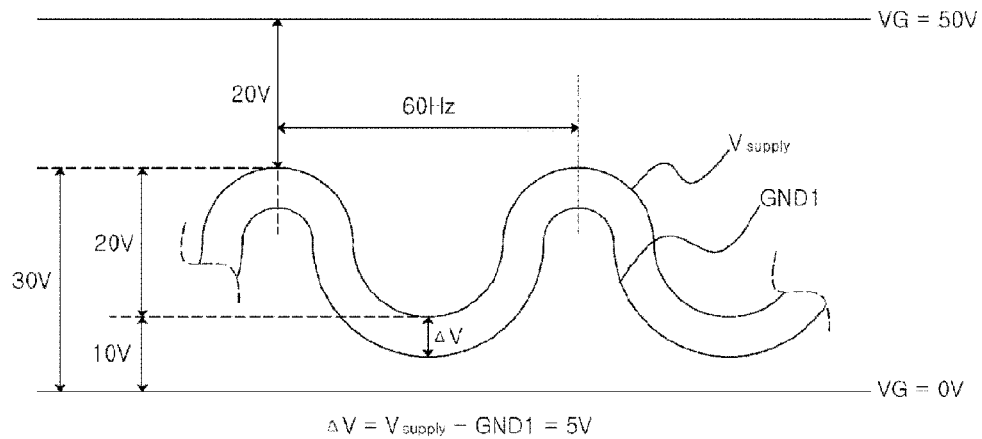
FIG. 7 is a diagram illustrating an AC voltage of which the amplitude and phase are regularly alternated.
Figure 8:
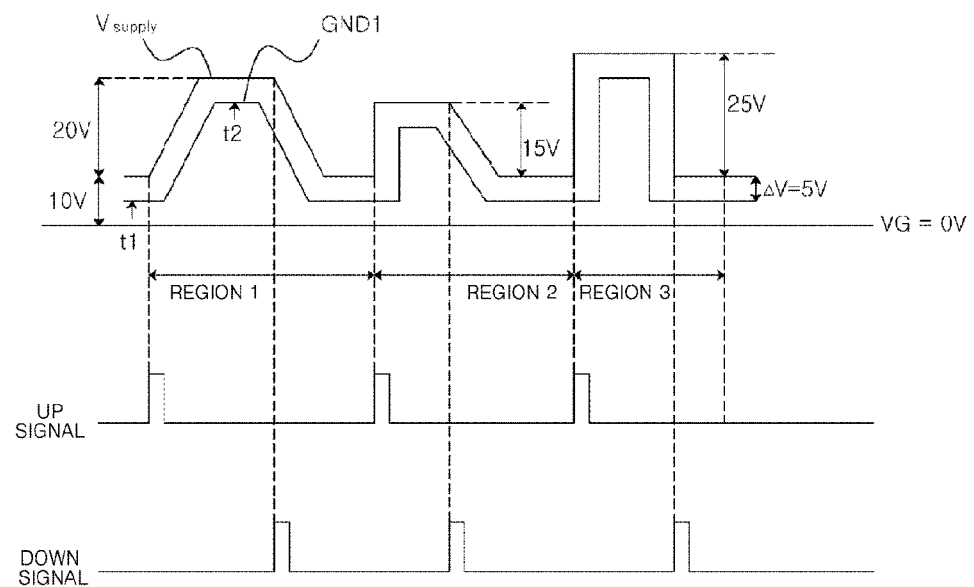
FIG. 8 is a diagram illustrating the AC voltage of which the amplitude and phase are irregularly alternated.

FIG. 7 is a diagram illustrating the alternating current voltage of which the amplitude and phase are regularly alternated and FIG. 8 is a diagram illustrating the alternating voltage of which the amplitude and phase are non-regularly alternated. First, the case of the alternating current voltage having the regular amplitude and phase will be described below with reference to FIG. 7.

FIG. 7 illustrates the AC voltage having the amplitude of alternating voltage of 20V as a Max voltage of 30V and a Min voltage of 10V based on the ground potential Therefore, the $V_{supply}$ is alternated at 20V based on the ground potential. The GND1 which is the system ground maintains 5V with the $V_{supply}$. Therefore, the GND1 which is the system ground is the AC power alternating at an amplitude of 20V as a Max voltage of 25V and a Min voltage of 5V based on the ground potential. As a result, the system power $V_{supply}$ is an AC voltage based on the ground potential but is 5V which is the DC voltage based on the GND1 (that is, when the GND1 is ground). Further, a period of the AC voltage is 60 Hz and the phase thereof is regular.

As illustrated in FIG. 7, the AC voltage of which the amplitude and phase are regular based on the ground potential may be applied as the system power but the AC voltage of which the amplitude and phase are non-regular may be applied as the system power and FIG. 8 is an embodiment thereof.

Referring to FIG. 8, the amplitude of the positive system power $V_{supply}$ based on the system ground GND1 is 5V and therefore the $V_{supply}$ based on the GND1 is the DC voltage. A range of fluctuation of the AC voltage of region 1 of FIG. 8 is 20 V, a range of fluctuation of the AC voltage of region 2 is 15 V, and a range of fluctuation or an amplitude of the AC voltage of region 3 is 25 V. The AC voltage of the region 1 has the same rising period and falling period and the AC voltage of the region 2 has different rising period and falling period from each other, which rises without a time delay at the time of rising and falls at a predetermined period at the time of falling. The AC voltage of the region 3 is the case of vertical rising and vertical falling at the time of rising and falling. The AC voltage of which the amplitude and phase is non-regular may be used as the system power.

According to the real use example, various AC voltages as illustrated in the regions 1 to 3 are not used as the system power and may be preferable to use one pattern. However, several patterns may be sequentially used in a previously programmed sequence.

A configuration of the system power like the embodiment of FIG. 8 is non-regular, but is a voltage of which the amplitude is changed based on the ground potential, and therefore according to the present invention, the voltage is also defined as the AC voltage (or alternating current voltage) and in the non-regular AC waveform, the period or the slope of the rising pattern or the falling pattern may arbitrarily be determined.

The alternating voltage of FIG. 8 may implement the rising and falling of voltage at the desired timing. The pattern for rising and falling of the previously programmed system power is generated in synchronization with an up or down signal provided from the detection system 20.

The object 18 is a human finger and when the button of the elevator is pressed with the human finger, a human body may be modeled as being grounded to the ground potential. In this case, the VG of FIG. 6 is 0 (zero) V and therefore the amplitude thereof is not changed. However, the system power is an alternating current voltage of which the amplitude is alternated based on the ground potential and therefore when the amplitude of the system power is changed, the potential of the point P of FIG. 6 is alternated in synchronization with the system power. Since the potential of the point P is alternated, power applied to the sensor 14 through the sensor signal line 16 is also a voltage which is alternated like the point P.

When the ground of the object 18 is the ground potential of 0V which indicates that there is no change in amplitude, if the amplitude of the system power applied to the sensor 14 is changed, the amplitude of voltage applied to the sensor capacitor cs formed between the object 18 and the sensor 14 is also changed in synchronization with the system power.

When the voltage applied to the capacitor having the same capacitance is changed, a difference in charge quantity charged depending on Equation of Q=CV occurs. As described above, when there is a difference in voltage applied to the sensor capacitor cs, it is possible to detect the capacitance of the sensor capacitor using the phenomenon that the difference in charge quantity charged in the sensor capacitor occurs. The detailed method thereof will be described below.

Most of the external potential VG applied to the object 18 is the earth ground and the external potential VG has the absolute size of 0 (zero) V and DC. Further, the ground of the upper system in which the detection system is included may be connected and the ground of the upper system may be the floating ground of the DC battery. The external ground may have a voltage higher or lower than the system power while being the DC in some cases. In FIG. 7, when VG=50 V, the external ground is higher than the system power and when VG=0, the external ground is lower than the system power. The AC power may be used in the object 18 as the ground VG, and the AC voltage is directly connected to the object 18 or the object 18 is adjacent to the three wavelength fluorescent light, and therefore the AC voltage may be indirectly applied to the object 18 like being electrically affected. When the AC power is used as the ground of the object, there is no connection with the AC power applied to the detection system 20. The AC power to be described below is the AC power which is applied to the detection system 20.

When the system power is the AC voltage, the AC voltage which is the system power needs to be applied to the buffer 16 of FIG. 6 and a proper voltage needs to be applied to the on/off control terminal or the input terminal 10-1 in consideration of the system power. To apply the voltage, a DC section needs to be present in the AC voltage which is the system power.

According to one embodiment of the present invention, the AC power has the DC section at the point of inflection at which the rising and the falling or the falling and the rising of the regions 1 to 3 of FIG. 8 are divided.

In the DC section of the AC power, all the capacitors commonly connected to the sensor 14 is charged. Further, in the DC section of the AC power, the operation of the signal detector 22 or the detection system 20 is performed or any signal is output to the outside and the external signal is received. The external structure transmitting and receiving a signal to and from the signal detector 22 or the detection system 20 is a CPU or is a circuit element associated with the input and output of the signal. The ground of the external structure may be equal to or different from the ground of the detection system.

When the ground of the external structure is different from the detection system 20, it is preferable to generate the input and output of the signal to and from the detection system 20 and the external structure in the state in which the ground of the external structure is connected to the ground of the detection system 20.

The AC voltage for detecting the sensor capacitance CS according to the embodiment of the present invention may detect the sensor capacitance CS in the whole region where the rising or the falling is made and to use the falling region, the AC voltage needs to rise in advance and to use the rising region, the AC voltage needs to fall in advance.

The charging at the point P of FIG. 6 using the $V_{chg}$ is preferably made in the DC section of the AC voltage, but the charging may be made even in the section in which the AC voltage rises in advance for the falling of the AC voltage or the section in which the AC voltage falls in advance for the rising of the AC voltage.

In the circuit of FIG. 6 according to the embodiment of the present invention, the potential of the point P is determined by the following <Equation 5>.

In the above <Equation 5>, the $V_p$ is the potential of the point P input to the buffer 15, the $V_{supply}$ is 20V in the case of FIG. 7 as the amplitude of the positive system voltage which is alternated, the region 1 of FIG. 8 is 20 V, and the region 2 of FIG. 8 is 15 V. The $V_{chg}$ is the charging voltage based on the earth ground and the CAUX is the capacitance of the equivalent capacitor of the storage capacitor cst or the parasitic capacitor cp. The CS is the capacitance of the sensing capacitor cs which is generated between the sensor 14 and the object 18.

In <Equation 5>, when the positive system power $V_{supply}$ rises, the $V_{supply}$ is a positive value and when the $V_{supply}$ falls, the $V_{supply}$ is a negative value. For example, after the $V_{chg}$ of FIG. 6 is 6V and the point P of FIG. 6 is charged with 6 V, when the switching device 10 is turned off and thus the point P is Hi-z, only a term of $V_p=(V_{supply}+V_{chg})$ of <Equation 5> acts due to the rising of 10V of the $V_{supply}$ in a normal case and thus the voltage of the point P is 16V. However, if it is assumed that $$\frac{CS}{CAUX + CS}$$

added in the present invention is 0.1, the $V_p$ of <Equation 5> is 15 V, which means that the point P needed to rise to 16V rises only to 15 V. As described below, 1V which is lack is determined as a term of $$V_{supply} \frac{CS}{CAUX + CS}$$

called "under swing element" and if the CAUX is known in advance, the CS may be detected or the variation of the CS may be detected over time.

Meanwhile, when the system power falls in <Equation 5>, as the amplitude of $V_{supply}$, −10V needs to be used. According to the embodiment of the present invention, when the $V_{chg}$ is 16V and the system power falls to 10V in the state in which the point P is charged and keeps the Hi-z state, the point P of FIG. 6 is generally 6 V. However, if it is assumed that $$\frac{CS}{CAUX + CS}$$

is 0.1, the $V_p$ of <Equation 5> is as follows.

$V_p=(16V-10V)-(-_{10}V)\times 0.1=7V$. This means that the point P needs to be 6V but does not fall by 1 V, in which 1V depends on the magnitude of the sensor capacitance and therefore the magnitude of the sensor capacitance may be known.

Referring to the waveform of the system voltage of FIG. 7 or 8, the positive system voltage $V_{supply}$ and the system ground GND1 keep a constant DC voltage and therefore the system ground GND1 based on the earth ground is also equal to the amplitude of the positive system voltage $V_{supply}$ which is alternated. Therefore, <Equation 5> may be represented by the following <Equation 6>.

$$V_P = (V_{supply} + V_{chg}) - V_{supply} \frac{CS}{CAUX+CS} \qquad \text{<Equation 5>}$$

$$V_P = (GND1 + V_{chg}) - GND1 \frac{CS}{CAUX+CS} \qquad \text{<Equation 6>}$$

In the following specification, the $V_{supply}$ included in the above Equation has the same alternating amplitude as the GND1 and therefore the $V_{supply}$ and the GND1 of the above <Equation 6> may be used as the same meaning, but the $V_{supply}$ is representatively used. Therefore, although the $V_{supply}$ is used in the above <Equation 6>, the GND1 may be instead used.

If there is no object 18 in FIG. 5, the sensor capacitor cs is not formed between the sensor 14 and the object 18 and the CS is 0 (zero), and therefore the above <Equation 6> is represented by the following <Equation 7>.

$$V_p = V_{supply} + V_{chg} \qquad \text{<Equation 7>}$$

Since the above <Equation 5> represents the potential of the point P detected by the signal detector 22 when the object 18 is present and the above <Equation 7> is the potential of the point P detected by the signal detector 22 when there is no object 18, it may be determined whether the object 18 approaches the sensor on the basis of a value obtained by subtracting the above <Equation 5> from the above <Equation 7>.

According to the embodiment of the present invention, it may be discriminated whether there is the object 18 approaching the sensor 14 but it is possible to detect the change in opposing direction or opposing area of the object 18 and the sensor 14.

According to one embodiment of the present invention which detects the change in opposing direction or the change in opposing area of the object 18 and the sensor 14, referring to the Equation of FIG. 4, when the change in opposing direction or opposing area of the object 18 and the sensor 14 occurs, the change in magnitude of the capacitance formed between the sensor 14 and the object 18 occurs. Therefore, when the sensor 14 and the object 18 have a predetermined opposing direction or opposing area, if the detected potential of the point P is set to be $V_p1$ and the potential of the point P depending on the change in opposing direction or opposing area of the sensor 14 and the object 18 is set to be $V_p2$, it is possible to detect the change in opposing distance or opposing area of the object 18 and the sensor 14 on the basis of the difference between the $V_p1$ and the $V_p2$ detected in the above <Equation 5>.

Referring to $$\frac{CS}{CAUX + CS}$$

of the above <Equation 5>, it may be arranged as follows.

(Arrangement 1) The capacitance of all the capacitors connected to the point P is positioned at a denominator.

(Arrangement 2) The capacitance of the capacitor which is not connected to the system ground GND1 is positioned at a numerator.

(Arrangement 3) The capacitance of the capacitor connected to the system ground GND1 is positioned at a denominator.

As described above, the CAUX is an equivalent circuit of the plurality of capacitances having one side connected the point P of FIG. 6 and the other side connected to the system ground GND1 and therefore the CAUX looks like one capacitance but is substantially configured of the capacitances of many capacitors. Further, in the above <Equation 5> based on FIG. 6, the capacitor in which the ground is connected to the external power is one but in another embodiment, the plurality of capacitors may be present.

The sensor capacitance CS of the sensor capacitor cs may be detected in all the cases in which the AC power which is the system power rises or falls and the detailed embodiment of the detection of the sensor capacitance CS based on the rising or falling of the AC power is as follows.

*Embodiment in the Case in which the System Power Rises

According to the embodiment which detects the sensor capacitor in the case in which the system power rises, the case in which the AC power of FIG. 8 is used as the system power in the detection system to which FIG. 6 is applied is as follows. If it is assumed that in the timing t1 just before the region 1 of FIG. 8, the point P of the detection system 20 is charged but the $V_{chg}$ which is the charging voltage is 6V and CAUX=20 pF, and CS=1 pF, when the $V_{supply}$ is swung by 20V from Min to Max, the value of the $V_{supply}$ is increased and therefore $V_{supply}$ of the above <Equation 5> is equal to +20 V. The amplitude of voltage detected at the point P after the swing is completed is as follows.

$$V_P = 20 + 6 - 20 \times \frac{1}{21} = 25.0476V \qquad \text{<Calculation Equation 1>}$$

If it is assumed that in the <Calculation Equation 1>, there is no sensor capacitor CS, the amplitude of $V_p$ is 26 V. This means that when the detection system makes the point P charged with 6V rise by 20 V, the $V_p$ is 26 V. However, if it is assumed that the CS is present and the magnitude of CS is 1 pF, this means that the $V_p$ is insufficient by 0.9524V to 26V. According to the embodiment of the present invention, it may be appreciated whether the sensor capacitor is present, that is, like the embodiment of the finger and the button of the elevator, the finger presses the button by detecting the under voltage. Further, it is possible to detect at how long the sensor 14 and the object 18 face each other or how large the opposing area is by detecting the change in amplitude of the under voltage and it is possible to detect the change in the opposing direction or the change in the opposing area by tracking the variation of the values. Referring to the above Equation of FIG. 4, when the opposing distance or the opposing area of the object 18 and the sensor 14 are changed, the capacitance is changed, and therefore when both of the opposing distance or the opposing area are changed, it is impossible to confirm by how much the capacitance is changed Therefore, it is preferable to detect the change in the opposing area or configure the system to make the opposing area constant when the opposing distance is constant and it is preferable to detect the size or the variation of the opposing distance when the opposing distance is changed.

Embodiment in the Case in which the System Power Falls

A method for detecting capacitance when the system power falls using the detection system of FIG. 6 and the AC power of FIG. 8 is as follows. First, the point P of FIG. 6 is charged. At the timing t2 which is the DC region of the region 1 of FIG. 8, the amplitude of voltage of the GND1 is 25V based on the ground potential. Therefore, at the timing t2 of the region 1 of FIG. 8, charging the Vcgh with 1V based on the GND1 at the point P of FIG. 6 has the same meaning as charging the $V_{chg}$ with 26V based on the earth ground. The point P of FIG. 6 is charged with the $V_{chg}$ which is 26V and it is assumed that the CAUX is 20 pF and CS=1 pF. Like the embodiment of the latter half of the region 1 of FIG. 1, when the $V_{supply}$ falls by 20 from Max to Min, the $V_{supply}$ is −20 V. Therefore, the magnitude of voltage detected at the point P after the system power falls by 20V is as follows on the basis of the above <Equation 5>.

$$V_P = (26-20) - (-20) \times \frac{1}{21} = 6.9524V \qquad \text{<Calculation Equation 2>}$$

Referring to the above <Calculation Equation 2>, the point P charged with 26V falls by 20 V, and therefore the point P needs to be 6 V, which means that the point P is lack by 0.9524V due to the sensor capacitor cs. Referring to the value, when the system power rises or falls in connection with the same parameter of the above <Equation 5>, it is shown that the value which does not reach a targeted value is the same.

FIG. 6 or the above <Equation 5> describes an example in which the object 18 connected to the external ground is one, but the plurality of objects 18 are present in any system and each object 18 is connected to the external ground of which the magnitude is equal to or different from each other. In the present specification, the plurality of external grounds are marked by VG1 and VG2, in which the VG1 and the VG2 include the case in which the amplitude is equal to or different from each other.

Figure 9A:
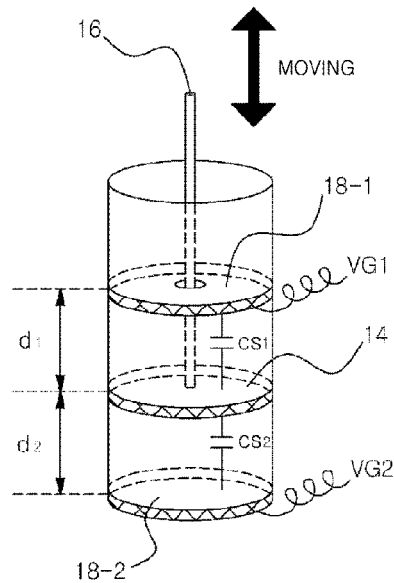
FIG. 9A and FIG. 9B are diagrams illustrating embodiments in which a plurality of objects are used in the system for detecting capacitance according to the embodiment of the present invention.

FIG. 9 illustrates an embodiment of the case in which the plurality of objects are used in the system 20 for detecting capacitance according to the embodiment of the present invention, in which FIG. 9A illustrates the case in which two objects 18-1 and 18-2 are fixed and the sensor 14 moves and the case in which d1 and d2 both are changed due to the movement of the sensor 14. The d1 is an opposing distance between the sensor 14 and the object 1 18-1 and the d2 is an opposing distance between the sensor 14 and the object 2 18-2. It is assumed that an opposing area of the sensor 14 and each object 18-1 and 18-2 is the same. An object which may move the sensor 14 is configured in the sensor 14 like the sensor signal line 16 and a displacement occurs between the sensor 14 and the objects 18-1 and 18-2 due to the movement of the sensor signal line 16. The object 1 18-1 is connected to the external ground 1 VG1 by a spring wire and the object 2 18-2 is connected to the external ground 2 VG2 by the spring wire. The sensor capacitor 1 cs1 is formed between the sensor 14 and the object 1 18-1 at the magnitude of capacitance CS1 and cs2/CS2 is also formed between the sensor 14 and the object 2 18-2. The magnitude of the CS1 and CS2 is changed depending on the movement of the sensor 14.

Figure 9B:
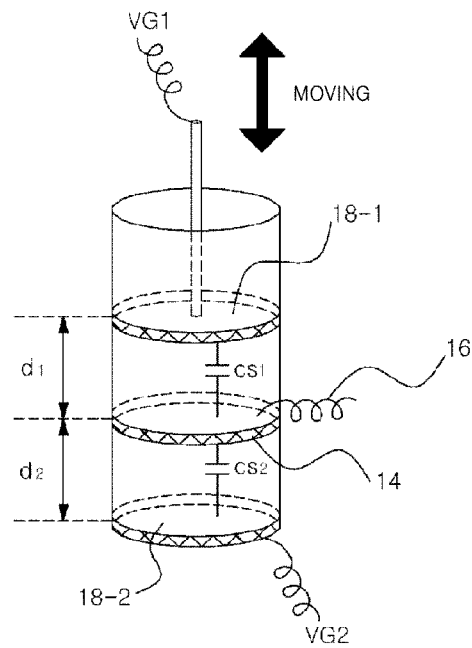

FIG. 9B illustrates the embodiment of the case in which the sensor 14 and the object 2 18-2 are fixed but the distance between the object 1 18-1 and the sensor 14 is changed due to the movement of the object 18-1. Referring to FIG. 9B, the object which may move the object 1 18-1 is connected to the external ground 1 VG1 which is connected to the object 1 18-1. The external ground 2 VG2 is connected to the object 2 18-2. In the embodiment illustrated in FIG. 9B, the sensor 14 and the object 2 18-2 are fixed and therefore the distance d2 therebetween is fixed and the magnitude of CS2 which is the capacitance formed therebetween is also fixed. However, the capacitance CS1 formed with object 1 is present at the other side of the sensor 14 and the magnitude of CS1 which is the capacitance formed therebetween is changed due to the movement of the object 1 18-1.

FIGS. 9A and 9B illustrate the case of the two objects, but a system which includes more sensors 14 and many objects forming the capacitor while facing the sensor may be implemented. The present specification describes an example of only the two objects but the principle of the present invention may be applied to more objects than that.

Figure 10:
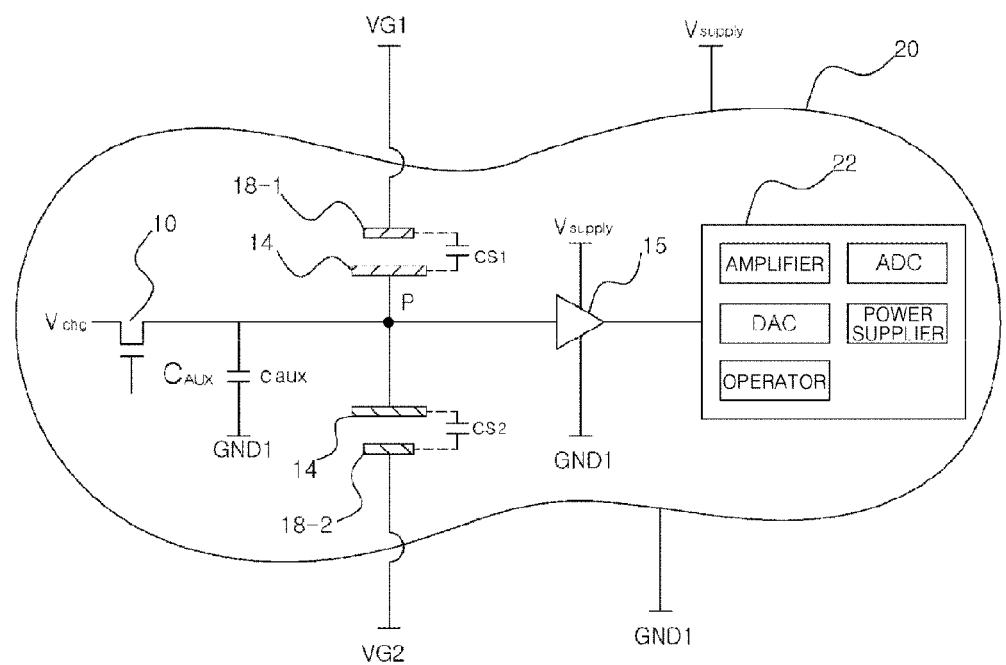
FIG. 10 is a circuit diagram of a system for detecting a plurality of sensor capacitances.

FIG. 10 is a circuit diagram of a system for detecting a plurality of sensor capacitances. Referring to FIG. 10, the two objects 18-1 and 18-2 facing the two sensors 14 are present and the two sensors 14 are each installed at both surfaces of one sensor or are different sensors. When the AC power alternated at the amplitude of $V_{supply}$ is supplied to the system 20 for detecting two sensor capacitances CS1 and CS2, the signal detected at the point P is as follows.

$$V_P = (V_{supply} + V_{chg}) - V_{supply} \frac{CS1 + CS2}{CAUX + CS1 + CS2} \qquad \text{<Equation 8>}$$

In the above <Equation 8>, $V_p$ represents the potential of the point P input to the buffer 15 and the $V_{supply}$ represents the amplitude of the alternating system voltage and the $V_{chg}$ represents the charging voltage based on the earth ground. The CAUX is the capacitance of the equivalent capacitor of the storage capacitor cst or the parasitic capacitor cp or is the capacitance of the equivalent capacitor of the cs and the cp. The CS is the capacitance of the sensor capacitor cs generated between the objects 18, the CS1 is the capacitance formed between the sensor 14 and the object 1 18-1, and the CS2 is the capacitance formed between the sensor 14 and the object 2 18-2.

In the above <Equation 8>, when the d1 and the d2 are changed altogether as illustrated in FIG. 9A, it is not easy to operate the d1 and the d2 individually. However, as illustrated in FIG. 9B, when the d2 is fixed, only the variation of the CS1 occurs and therefore it is possible to detect the size of d1 or the size in opposing area of the object 1 18-1 and the sensor 14 or the change in size of the opposing area.

The above (arrangement 1) to (arrangement 3) are identically applied to even the case of detecting the plurality of sensor capacitances.

The above <Equation 8> is the same as the following <Equation 9> when Equation of the signal detected at the point P for the two objects 18-1 and 18-2 or Equation of the signal detected at the point P of FIG. 10 in the case in which the object connected to the external ground is at least two is generalized.

$$V_P = (V_{supply} + V_{chg}) - V_{supply} \frac{CS1 + CS2 + \ldots + CSn}{CAUX + CS1 + CS2 + \ldots CSn} \qquad \text{<Equation 9>}$$

In the above <Equation 9>, $V_p$ represents the potential of the point P input to the buffer 15 and the $V_{supply}$ represents the amplitude of the alternating system voltage and the $V_{chg}$ represents the charging voltage based on the earth ground. The CAUX is the capacitance of the equivalent capacitor of the storage capacitor cst or the parasitic capacitor cp. The CS is the capacitance of the sensor capacitor cs generated between the objects 18, the CS1 is the capacitance formed between the sensor 14 and the object 1 18-1, and the CS2 is the capacitance formed between the sensor 14 and the object 2 18-2. Further, n is the number of plurality of objects facing the sensor 14 while being connected to the external ground, in which n is proportional to the number of objects like the case in which when the number of plural objects is one, n is 1 when the number of plural objects are two, n is 2, and when the number of plural objects are three, n is 3. When n is 1, the above <Equation 9> is the above <Equation 5> and when n is 2, the above <Equation 9> is the above <Equation 8>.

The above (arrangement 1) to (arrangement 3) are identically applied to even the plurality of objects 18.

When the plurality of sensor capacitors cs are used in the detection system 20, the plurality of objects may face one sensor 14 and one object may face one sensor.

Referring to the above <Equation 9> and the above (arrangement 1) to (arrangement 3), a plurality of sensor capacitances CSn which are generated due to the plurality of objects 18 are commonly connected to the signal detector 22 of the detection system 20. Since the plurality of sensor capacitors csn are connected to the external ground VG, the plurality of sensor capacitors csn are operated as a variable capacitor and generating the charge sharing with the fixed capacitor is the same as the foregoing. However, when the displacement or the change in the opposing area occurs in the plurality of objects and the plurality of sensors 14 configuring the plurality of sensor capacitors, it may not be appreciated whether the change in opposing area or opposing distance occurs between any object 18 and the sensor 14. Therefore, only when the displacement or the change in the opposing area occurs between the sensors 18 facing only one of the plurality of objects 18 configuring the plurality of sensor capacitors csn, it may appreciate the object which leads to the change in the sensor capacitance CS.

When the object which leads to the change in the sensor capacitance CS in the plurality of objects is defined as a dynamic object and the object which does not lead to the change is defined as a static object, the change in the sensor capacitance occurs due to the dynamic object and therefore the $V_p$ in the above <Equation 9> may be detected but the dynamic object does not lead to the change in the sensor capacitance CS of the above <Equation 9> and therefore the change in $V_p$ defined in the above <Equation 9> does not occur.

The embodiment of the present invention may use the principle to extract the variation of the variable capacitance which occurs due to one dynamic object in the detection system configured of the plurality of variable capacitances.

Referring to the above <Equation 9>, after the $V_p$ which is detected due to the dynamic object and the variable object at any timing is stored in a memory of the detection system which is not illustrated and the $V_p$ is again detected after a predetermined time elapses, it may appreciate the change in magnitude of the sensor capacitance CS of which the magnitude is changed due to the dynamic object by analyzing a difference between the $V_p$ which is detected in advance and stored in the memory and the following $V_p$.

It is assumed that the distance between the object and the sensor is fixed, when the variation of the magnitude of the sensor capacitor is substituted into the Equation of FIG. 4, it is possible to extract the variation of the area of the dynamic object and the sensor, and therefore a secondary operation due to the variation of the area of the dynamic object and the sensor, for example, the operation associated with the change in the moving speed of the elevator may be performed.

It is impossible to detect the plurality of capacitances CSn formed between the plurality of objects 19 and the sensor 14 of the above <Equation 9> by the signal detection using the above <Equation 9> once and a method for detecting one sensor capacitance in which the capacitance is not fixed in the state in which the rest of the sensor capacitances other than one sensor capacitance is fixed is more preferable.

Meanwhile, when the term $$V_{supply} \frac{CS1 + CS2 + \ldots + CSn}{CAUX + CS1 + CS2 + \ldots CSn}$$

of the above <Equation 9> is defined as the "under swing element", it may be appreciated that the under swing element is proportional to the amplitude of alternating system power and is proportional to the magnitude of sensor capacitance CS. Referring to the above <Calculation Equation 1> or <Calculation Equation 2>, the "under swing element" is a factor of allowing the sensor 14 to a value at which the alternating voltage is not alternated at the same size as the variation of the system power when the system power is alternated.

The "under swing element" occurs on the basis of the charge sharing phenomenon between the capacitors commonly connected to the point P of FIG. 6 or FIG. 10, that is, the input terminal of the signal detector 22 and the charge sharing phenomenon according to the embodiment of the present invention may be arranged as follows.

(Arrangement 4) The capacitors commonly connected to the input terminal 15 of the signal detector 22 of the same detection system 20 accumulate a predetermined charge quantity. To this end, the input terminal 15 is charged with the $V_{chg}$ and the charge quantity charged in each capacitor is defined as an initial charge quantity due to the $V_{chg}$.

(Arrangement 5) A portion of the capacitor of the above arrangement 4 is connected to the external ground. The capacitor connected to the external ground is called the "variable capacitor". The sensor capacitor cs is the variable capacitor.

(Arrangement 6) A portion of the capacitor of the above arrangement 4 is connected to the system ground GND1. The capacitor connected to the system ground is called the "fixed capacitor". The auxiliary capacitor caux is the fixed capacitor.

(Arrangement 7) Since the system power is the AC power, when the system power performs the swing action of rising or falling, the voltage applied to the variable capacitor of the above (Arrangement 5) has a varying amplitude in synchronization with the system power. Depending on the principle of Q=CV, the difference in the charge quantity accumulated in the capacitor occurs due to the change in voltage applied to the capacitor having the same capacitance, and therefore when the voltage applied to the variable capacitor is increased, more charges than the initial charge quantity are accumulated and when the voltage applied to the variable capacitor is low, the accumulated charge is discharged and therefore a charge smaller than the initial charge quantity is accumulated.

(Arrangement 8) Since the fixed capacitor is connected to the system ground, the point P is synchronized due to the alternating of the system power and thus even though the system power is alternated at the same amplitude, the amplitude of voltage applied to the fixed capacitor is not changed by the effect of the alternating system ground. Therefore, the initial charge quantity of the fixed capacitor is continuously kept even when the system voltage is alternated.

(Arrangement 9) The charge discharged from the variable capacitor is distributed and accumulated in the fixed capacitors and the voltage of the fixed capacitor rises due to the principle of Q=CV.

(Arrangement 10) When the variable capacitor accumulates more charges, the fixed capacitors discharge charges to the variable capacitor and the voltage of the fixed capacitor falls on the basis of the principle of Q=CV.

(Arrangement 11) The voltage of the point P based on the system ground GND1 is determined at the amplitude of voltage applied to the fixed capacitor, and therefore the amplitude in voltage of the point P is changed based on the system ground on the basis of (Arrangement 9) and (Arrangement 10).

(Arrangement 12) When the change in amplitude of voltage is detected based on the system ground GND1 (Arrangement 11), it may appreciate the magnitude of the variable capacitance or the change in magnitude of the variable capacitance.

Based on the arrangement, the embodiment of the charge sharing phenomenon by the alternating of the system power will be described below with reference to FIGS. 8 and 10. The following description refers to the embodiment of FIG. 9B, and therefore two objects face one sensor 14. The object 2 18-2 and the sensor 14 are fixed and therefore the magnitude of CS2 is not changed. Further, the sensor capacitance 1 (CS1) formed between the sensor 14 and the object 1 18-1 keeps the same opposing area and when the opposing distance is changed or the same opposing distance keeps and the opposing area is changed, the magnitude of the sensor capacitance 1 CS1 is changed, but the embodiment of the present invention illustrates an example in which the same opposing distance (d1 of FIG. 9) is kept and the opposing area is changed and thus the magnitude of CS1 is changed. However, the method is only one embodiment and even the opposing area of the sensor 14 and the object 1 18-1 is constant but the opposing distance d1 therebetween is changed, it is apparent to those skilled in the art that the CS1 is changed.

According to the embodiment of the present invention, it is possible to detect whether the object 1 18-1 is present and it is possible to detect the variation of the opposing area of the object 1 18-1 and the sensor 14. For example, in FIG. 9B, it is possible to detect the potential $V_p$ of the point P generated by the opposing area of the sensor 14 and the object 1 18-1 at any timing and it is possible to detect the variation of the opposing area of the object 1 18-1 and the sensor when the variation of the $V_p$ is detected over time. For example, the assumption that in the above <Equation 9>, the amplitude of $V_p$ is 25V and the amplitude of $V_p$ is 24V after a predetermined time lapses means that the magnitude of CS1 is increased and the opposing area of the object 1 18-1 and the sensor 14 is increased.

Hereinafter, the embodiment of detecting the sensor capacitance CS on the basis of the rising or falling of the system power will be described in more detail which is an embodiment applied to the above arrangements.

Embodiment of Detecting Sensor Capacitance on the Basis of the Rising of System Power 1. Embodiment of (Arrangement 4)

In FIG. 10, the object 1 18-1 faces the sensor 14 at a predetermined fixed distance and a variable area to form the variable capacitance having a magnitude marked by the CS1 and the CS2 is the variable capacitance to which the external ground is connected or the magnitude of capacitance is fixed.

It is assumed that the VG1 which is the ground of the object 1 18-1 is assumed and it is assumed that the VG2 which is the ground of the object 2 18-2 is 4V DC based on the ground potential. If it is assumed that the $V_{chg}$ based on the ground potential is 6V, when the switching device 10 is turned on at the timing "t1" of FIG. 8, the point P of FIG. 10 is charged with 6V. Therefore, the point P of FIG. 10 is 6V based on the ground potential but the size of the point P of FIG. 10 based on the GND1 of which the amplitude is 5V at the timing t1 of FIG. 8 is 1 V.

As the point P of FIG. 10 is charged with the voltage of $V_{chg}$, the capacitor connected to the point P of FIG. 10 is formed with a voltage based on the potential applied to another side of the capacitor. For example, the caux which is the auxiliary capacitor is connected to the system ground GND1 and since the amplitude of the system ground GND1 is 5V at the timing t1, an amplitude of the initial voltage formed in the caux is 1V based on the system ground GND1. The reason for considering the initial voltage of the auxiliary capacitor caux as a reference to the system ground GND1 is that the auxiliary capacitor caux is connected to the system ground GND1 and as the reference voltage of the sensor capacitor is connected to the external ground, the external ground VG is set.

Since the VG1 connected to the sensor capacitor cs1 is 0 (zero) V and the point P is 6 V, the sensor capacitor 1 cs1 based on the VG1 is formed with 6V and the initial voltage of the cs1 based on the VG1 is 6 V. Further, since the VG2 is 4V and the point P is 6 V, the initial voltage of the sensor capacitor 2 cs2 is 2 V.

Meanwhile, each capacitor is accumulated with a predetermined charge quantity depending on the capacitance of the capacitor and the formed voltage by a physical quantity called Q=CV. For example, the cs1 is charged with the predetermined charge quantity depending on the capacitance CS1 and the initial voltage 6V and the auxiliary capacitor caux is charged with the charge quantity corresponding to the capacitance CAUX and the initial voltage 1 V.

As such, all the capacitors connected to the point P are charged with the capacitance of the capacitor and the voltage and a charge quantity charged before the alternating of the system power is generated is called an initial charge quantity.

2. Embodiment of (Arrangement 5) and (Arrangement 7)

The object 1 18-1 of FIG. 10 is connected to the external ground VG1, not the system ground GND1 and the object 18-2 of FIG. 10 is connected to the external ground VG2. When the system power applied to the detection system 20 of FIG. 10 rises by 20V like the front half of the region 1 of FIG. 8, the point P of FIG. 10 also rises by 20V in synchronization with the system power. Even though the system power rises by 20 V, the amplitude of the external grounds VG1 and VG2, not the system power, is not changed, and therefore the amplitude of voltage applied to the cs1 and cs2 is changed by 20V since the point P rises by 20V. That is, as the point P gradually rises, when 6V which is the initial voltage of the cs1 is 26 V, 2V which is the initial voltage of the cs2 is 22V (the under voltage is actually generated due to the charge sharing phenomenon but this is limited to only the case in which the variable capacitor and the fixed capacitor do not share a charge).

As the system voltage rises, the voltage formed in the cs1 and the cs2 is increased and the charge quantity accumulated in the cs1 and the cs2 is also increased by Equation Q=CV. When the initial voltage of the cs1 is changed from 6V to 26V and the magnitude of the CS1 is not changed, that is, when the opposing area and the opposing distance of the object 1 18-1 and the sensor 14 are not changed, it is possible to accumulate more charges in proportion to a difference of 20V at 26V which is 20V larger than 6V which is the initial voltage.

Further, the initial voltage of the cs2 is 2V and the voltage applied to the cs2 due to the rising of the system power rises to 22V and therefore the cs2 may accumulate more charges in proportion to 20V which is an increment of the system voltage.

3. Embodiment of (Arrangement 6) and (Arrangement 8)

The auxiliary capacitor caux of FIG. 10 is connected to the system ground GND1. Therefore, when the system power applied to the detection system 20 of FIG. 10 rises by 20V by the pattern of the front half of the region 1 of FIG. 8, the system ground GND1 rises, and therefore the amplitude of voltage applied to the auxiliary capacitor caux is not changed (however, the assumption that the voltage is not affected by the variable capacitor).

The initial voltage applied to the auxiliary capacitor caux is 1V based on the system ground GND1 and even though the system voltage rises by 20 V, the system ground GND1 rises by 20V and therefore the voltage applied to the caux keeps the state of 1V which is the initial voltage. Therefore, even when the system power rises, the voltage of the auxiliary capacitor connected to the system ground is not changed and the accumulated charge quantity is not changed.

4. Embodiment of (Arrangement 9), (Arrangement 10), and (Arrangement 11)

Referring to FIG. 10, when the alternating of the system power is completed and the charge sharing phenomenon is completed to allow the detection system 20 to detect the point P, the switching device 10 is in an off state and the input terminal of the buffer 15 is in the Hi-z and therefore the point P is in the Hi-z state or the floating state. In the Hi-z stator or the floating state, it is impossible to supply a charge from the outside of the detection system to the point P and a total amount of the charge at the point P is conserved by a charge conservation law.

The variable capacitors cs1 and cs2 may accumulate more charges and therefore the charge required in the variable capacitor is supplied from the auxiliary capacitor caux connected to the system ground GND1. Even when the system power rises, the accumulated charge quantity of the auxiliary capacitor caux is not changed and therefore when the charge of the auxiliary capacitor is supplied to the variable capacitor, the charge quantity of the auxiliary capacitor is reduced and the amplitude of voltage formed in the auxiliary capacitor is reduced by the principle of Q=CV. That is, the magnitude of the auxiliary capacitance CAUX is in the unchanged state and therefore when the charge quantity Q is reduced, the voltage V is reduced.

The auxiliary capacitor is connected between the point P and the system ground GND1 and therefore the reduction in voltage of the auxiliary capacitor means that the voltage of the point P based on the system ground GND1 is reduced.

Therefore, the point P charged with the $V_{chg}$ which is 6V needs to be 26V by the system power which rises by 20V like the front half of FIG. 8 but does not reach 26V and the amplitude of voltage which does not reach 26V is determined on the basis of the "under swing element" of the above <Equation 9>.

5. Embodiment of (Arrangement 12)

Referring to the above <Equation 8>, when no object 1 18-1 is present, no CS1 is present. In this case, the detected voltage $V_p1$ is known and the predetermined CS1 is formed by the appearance of the object 1 18-1. In this case, when the voltage $V_p2$ detected by the above <Equation 8> is known, the difference between the $V_p1$ and the $V_p2$ is operated and thus it may be confirmed whether the object 1 18-1 appears. Based on the principle, when a finger touches the button of the elevator, it is possible to operate the elevator.

Further, when the opposing area of the object 1 18-1 and the sensor 14 is changed, the magnitude of CS1 is changed depending on Equation of FIG. 4 and the changed magnitude of CS1 may be known depending on the above <Equation 4>, and therefore it is possible to detect the change in opposing area of the object and the sensor (when the opposing area is fixed, the change in the opposing distance may be detected). For example, in the above <Equation 8>, based on the detected $V_p1$ for the fixed CS2 and any CS1, when the magnitude of CS1 is changed, it is possible to detect the change in magnitude of the CS1 based on the "$V_p1-V_p2$" which is the change in amplitude of the detected $V_p2$. As a result, according to the tendency that plural human fingers press the button of the elevator over time, it is possible to perform a control to make a speed of the elevator fast when it is detected that a touch area between the button and the finger is gradually increased and to make the speed of the elevator slow when the touch area of the finger and the button is gradually reduced.

The embodiment of the present invention is described with reference to FIG. 10 in which the object is two, but the case in which the object is equal to or more than two is described with reference to the above <Equation 9>.

Embodiment of Detecting Sensor Capacitance on the Basis of the Falling of System Power Even when the system power falls like the pattern of the latter half of the region 1 of FIG. 8, it is possible to detect the absolute magnitude of the sensor capacitance CS or the change in magnitude of the sensor capacitance CS on the basis of the charge sharing phenomenon.

When the system power completes the charging at the timing t2 of the region 1 of FIG. 1 and then falls, the voltage applied to the variable capacitor is reduced and thus the charge quantity accumulated in the variable capacitor cs is reduced. The charge discharged due to the reduction in accumulated charge quantity of the variable capacitor is accumulated in the fixed capacitor, which increases the voltage of the fixed capacitor caux and thus increases the voltage of the point P. Therefore, when the system power falls, the point P generates the under voltage which prevents the system power from falling as much as the falling of the system power and determining the amplitude of under voltage on the basis of the "under voltage element" of the above <Equation 9> is the same as the embodiment of the case in which the foregoing system power rises.

When the system power falls, according to one embodiment of detecting the sensor capacitance CS1, when the $V_{supply}$ based on the earth ground in FIG. 10 is 30V, the GND1 is 25V, the $V_{chg}$ is 26V, the VG1 is 0V, and the VG2 is 4V, the $V_{chg}$ is 1V larger than the GND1. When the system power falls by 20V by the down signal of the region 1 of FIG. 8 in the state in which the point P is charged with the $V_{chg}$ and the switching device 10 is turned off, the potential of the point P needs to be 6V but does not reach 6V by the charge sharing phenomenon of the capacitors commonly connected to the point P and thus is a voltage larger than 6V and the amplitude of under voltage of a voltage which does not reach 6V is determined on the basis of the "under voltage element" of <Equation 9>.

The method for detecting capacitance connected to system power which is the AC increases the detection signal detected at the point P to make the SNR better.

If in the above <Equation 5>, the capacitance CS of 1 pF is formed between the object 18 and the sensor 14, in <Calculation Equation 2>, $V_p$=6.95238V. When the opposing distance or the opposing area between the object 18 and the sensor 14 are changed and thus CS=0.9 pF, the value of <Calculation Equation 2> becomes $V_p$=6.86124 V. The difference of the $V_p$ due to 0.1 pF of the CS is 91 mV. When this is applied to 10 bit ADC using 1V as the detection range, this has a resolution of about 9% and therefore reaches a level to be detectable even when there is noise at several % in the ADC. According to the existing embodiment, the resolution is only about 1% and therefore the SNR is low, such that the signal may not be reliable. However, according to the means for detecting capacitance connected to AC power, a level of the signal detected by the detection system 20 may be increased by about 9 times and therefore the SNR is improved, such that the detection signal may be reliable.

The signal detector 22 is embedded in the detection system. An ADC unit, a DAC unit, an amplifier, a power supplier, and circuit elements required to detect a signal are included in the signal detector 22. The DAC is used to detect the potential of the point P and the detected potential is amplified by the amplifier and then is input to the ADC. The signal converted into a digital signal by the ADC unit is transferred to an operator to operate the capacitance of the cs or operate the variation of the CS. The process is one embodiment and therefore it is apparent to those skilled in the art that another embodiment may be performed. Further, the signal detector 22 may include other circuits which are not illustrated.

As such, since the change in capacitance to be detected is positioned at a numerator of the detection Equation and therefore the detection sensitivity is improved, the apparatus for detecting capacitance connected to AC power may stably detect a signal.

It will be obvious to those skilled in the art to which the present invention pertains that the present invention described above is not limited to the above-mentioned exemplary embodiments and the accompanying drawings, but may be variously substituted, modified, and altered without departing from the scope and spirit of the present invention.

The invention claimed is:

1. An apparatus for detecting a variable capacitance, the apparatus comprising:
   a fixed capacitor configured to have a fixed capacitance;
   a variable capacitor configured to generate the variable capacitance;
   a switching device configured to charge the fixed capacitor and the variable capacitor with a DC voltage, or to keep the fixed capacitor and the variable capacitor in a floating state to conserve a charged charge after being charged; and
   a signal detector to detect a change in voltage due to a charge flowing between the fixed capacitor and the variable capacitor,
   wherein the signal detector detects the change in voltage in synchronization with an alternating current (AC) voltage which is applied to the fixed capacitor, and acquires the variable capacitance on the basis of the detected change in voltage,
   wherein the fixed capacitor is connected to a system ground voltage,
   wherein the system ground voltage has the same frequency as a frequency of the AC voltage, and has an amplitude with a constant difference from an amplitude of the AC voltage, and
   wherein the variable capacitor generates the variable capacitance when an external object approaches or contacts the variable capacitor.

2. The apparatus of claim 1, wherein the variable capacitor generates the variable capacitance changing in response to an opposing distance from the external object or an opposing area between the variable capacitor and the external object.

3. The apparatus of claim 1, wherein the fixed capacitor has an equivalent capacitance corresponding to a capacitance of a parasitic capacitor generated by a connection to the signal detector and a capacitance of a storage capacitor in which the charge is stored.

4. The apparatus of claim 1, wherein the variable capacitor is connected to a ground which is an earth ground in which a DC voltage is zero, or to a DC voltage having a constant amplitude.

5. The apparatus of claim 4, wherein, when the signal detector outputs a detection result, the system ground voltage and the ground are connected to each other and the AC voltage keeps a DC voltage having a constant amplitude.

6. The apparatus of claim 4, wherein the system ground voltage and the AC voltage have a first frequency during a first duration and a second frequency during a second duration, wherein the first and second frequencies are different from each other, and wherein the first and second durations are alternated with each other.

7. The apparatus of claim 1, further comprising a plurality of added variable capacitors, the plurality of added variable capacitors generating variable capacitances with a plurality of external objects that approach or contact the plurality of added variable capacitors individually.

8. A method for detecting a variable capacitance by an apparatus including a fixed capacitor configured to have a fixed capacitance, a variable capacitor configured to generate the variable capacitance, and a switching device configured to charge the fixed capacitor and the variable capacitor with a DC voltage, or to keep the fixed capacitor and the variable capacitor in a floating state to conserve a charged charge after being charged, the method comprising:
   detecting, by a signal detector, a change in voltage due to a charge floating between the fixed capacitor and the variable capacitor; and
   acquiring the variable capacitance on the basis of the change in voltage,
   wherein the signal detector detects the change in voltage in synchronization with an alternating current (AC) voltage which is applied to the fixed capacitor, wherein the fixed capacitor is connected to a system ground voltage, wherein the system ground voltage has the same frequency as a frequency of the AC voltage, and has an amplitude with a constant difference from an amplitude of the AC voltage, and wherein the variable capacitor generates the variable capacitance when an external object approaches or contacts the variable capacitor.

9. The method of claim 8, wherein the variable capacitor generates the variable capacitance changing in response to an opposing distance from the external object or an opposing area between the variable capacitor and the external object.

10. The method of claim 8, wherein the fixed capacitor has an equivalent capacitance corresponding to a capacitance of a parasitic capacitor generated by a connection to the signal detector and a capacitance of a storage capacitor in which the charge is stored.

11. The method of claim 8, wherein the variable capacitor is connected to a ground which is an earth ground In which a DC voltage is zero or to a DC voltage having a constant amplitude.

12. The method of claim 11, wherein, when the signal detector outputs a detection result, the system ground voltage and the ground are connected to each other and the AC voltage keeps a DC voltage having a constant amplitude.

13. The method of claim 11, wherein the system ground voltage and the AC voltage have a first frequency during a first duration and a second frequency during a second duration, wherein the first and second frequencies are different from each other, and wherein the first and second durations are alternated with each other.

14. The method of claim 8, wherein the apparatus further comprises a plurality of added variable capacitors, the plurality of added variable capacitors generating variable capacitances with a plurality of external objects that approach or contact the plurality of added variable capacitors individually.

* * * * *